US006862220B2

(12) United States Patent
Kawahara et al.

(10) Patent No.: US 6,862,220 B2
(45) Date of Patent: Mar. 1, 2005

(54) SEMICONDUCTOR DEVICE

(75) Inventors: Takayuki Kawahara, Higashiyamato (JP); Nozomu Matsuzaki, Kokubunji (JP); Terumi Sawase, Hanno (JP); Masaharu Kubo, Hachioji (JP)

(73) Assignee: Renesas Technology Corporation, Tokyo (JP)

( * ) Notice: Subject to any disclaimer, the term of this patent is extended or adjusted under 35 U.S.C. 154(b) by 0 days.

(21) Appl. No.: 10/886,725

(22) Filed: Jul. 9, 2004

(65) Prior Publication Data

US 2004/0246780 A1 Dec. 9, 2004

Related U.S. Application Data

(63) Continuation of application No. 10/309,238, filed on Dec. 4, 2002, now Pat. No. 6,785,165.

(30) Foreign Application Priority Data

Jan. 25, 2002 (JP) .................................. P2002-016466

(51) Int. Cl.$^7$ ............................................. G11C 16/04
(52) U.S. Cl. .............................. 365/185.28; 365/189.01
(58) Field of Search ....................... 365/185.28, 189.08, 365/189.01

(56) References Cited

U.S. PATENT DOCUMENTS

| 4,892,114 A | * | 1/1990 | Maroney et al. ......... 137/87.03 |
| 5,388,239 A | | 2/1995 | Iimura et al. |
| 5,805,477 A | | 9/1998 | Perner |
| 6,586,771 B2 | | 7/2003 | Suzuki |

FOREIGN PATENT DOCUMENTS

EP          1 085 519 A1      9/2000

OTHER PUBLICATIONS

Sohrab Kianian, Amitay Levi, Dana Lee, and Yaw-Wen Hu, A Novel 3 Volts-Only, Small Sector Erase, High Density Flash E$^2$PROM, 1994 Symposium of VLSI Technology Digest of Technical Papers (1994 IEEE), pp. 71-72.

* cited by examiner

*Primary Examiner*—Thong Q. Le
(74) *Attorney, Agent, or Firm*—Reed Smith LLP; Stanley P. Fisher, Esq.; Juan Carlos A. Marquez, Esq.

(57) ABSTRACT

A semiconductor device including a nonvolatile memory unit and a variable logic unit mounted on a chip is configured to achieve higher speed operation at a lower voltage. The semiconductor device includes a nonvolatile memory unit comprising a plurality of rewritable nonvolatile memory cells and a variable logic unit whose logical functions are determined, according to logic constitution definition data to be loaded into storage cells thereof. A nonvolatile memory cell essentially has a split gate structure composed of a selecting MOS transistor and a memory MOS transistor and constructed such that the dielectric withstand voltage of the gate of the selecting MOS transistor is lower than that of the memory MOS transistor or the gate insulation layer of the selecting MOS transistor is thinner than that of a high-voltage-tolerant MOS transistor. Because the selecting MOS transistor has a high Gm, a sufficiently great current for reading can be obtained.

16 Claims, 42 Drawing Sheets

F I G. 5

| | Vsg | Vmg | Vd | Vs | Vwell | Method |
|---|---|---|---|---|---|---|
| Program (injection) | ~Vt | 10 | 5 | 0 | 0 | Source Side Injection |
| Erase (ejection) | 0 | 12 | 0 | 0 | 0 | FN (to memory gate) |
| | 0 | -12 | 0 | 0 | 0 | FN (to PWEL) |
| Read | 1.8 | 0 | 0 | 1.8 | 0 | Reverse read |
| | 1.8 | 0 | 1.8 | 0 | 0 | Forward read |

FIG. 15

|  | WR1 | WS1 | WS2 | G1 | G2 | I | O |
|---|---|---|---|---|---|---|---|
| ERASURE | 0 | 0 | 0 | 12V | 1.5V | 0 | 0 |
| WRITING | 0 | 6V | 8V | 8V | 1.0V | 0 | 0 |
| NO WRITING | 0 | 6V | 0 | 8V | 0 | 0 | 0 |
| USUAL OPERATION (READ) | 1.5V | 0 | 0 | 0 | 0 | MAKE (NO WRITING) / BREAK (WRITING) | |

F I G. 2 0
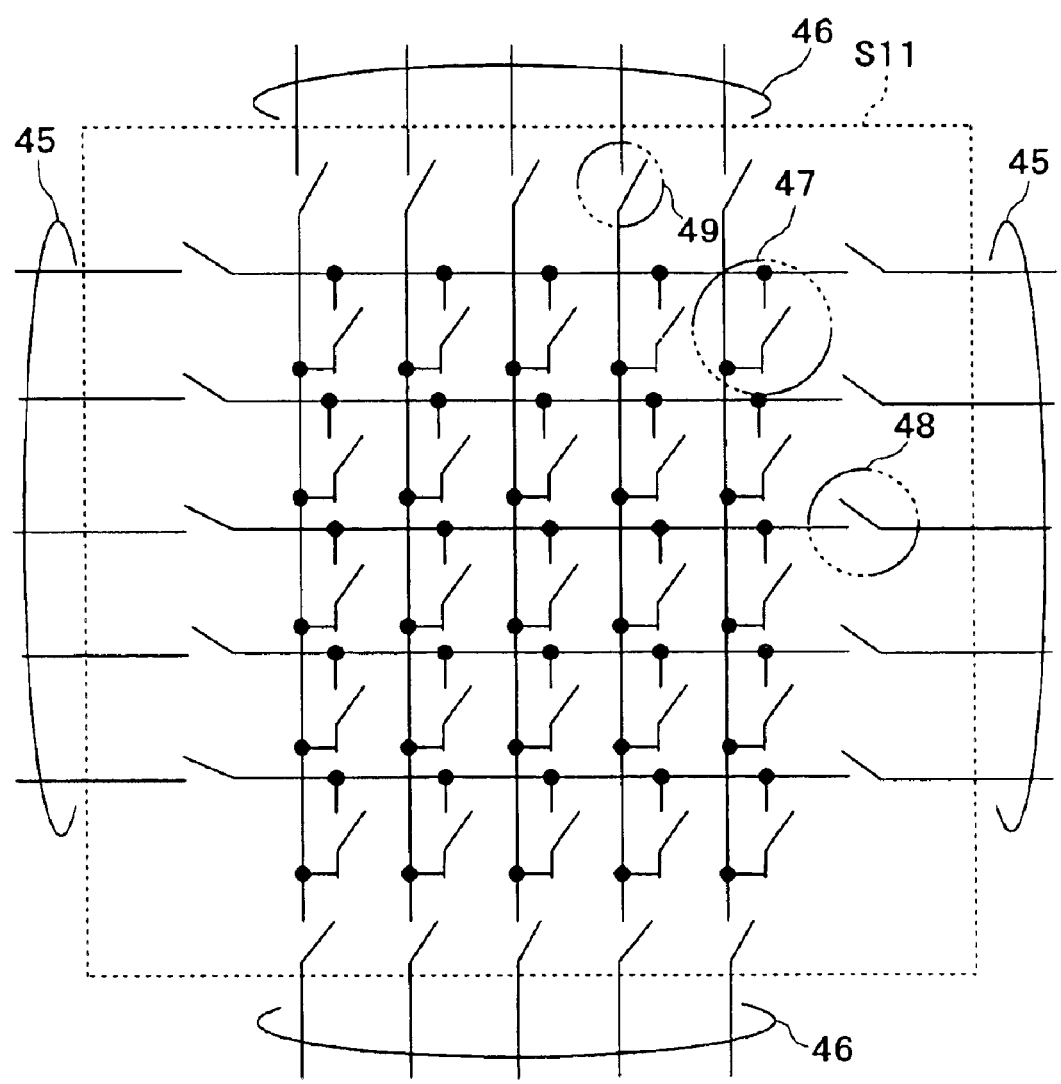

SEMICONDUCTOR DEVICE

CROSS-REFERENCE TO RELATED APPLICATIONS

This application is a Continuation application of U.S. application Ser. No. 10/309,238 filed on Dec. 4, 2002, now U.S. Pat. No. 6,785,165. Priority is claimed based on U.S. application Ser. No. 10/309,238 filed on Dec. 4, 2002, which claims priority to Japanese Patent Application No. 2002-016466 filed Jan. 25, 2002.

BACKGROUND OF THE INVENTION

1. Field of the Invention

The present invention relates to a semiconductor device including a nonvolatile memory unit in which data once stored therein can be rewritten and a variable logic unit whose logical functions can be set programmably, and relates to a technique for constructing such semiconductor device, the technique being effective in application to, for example, a microcomputer of a system-on-chip type or a system LSI.

2. Description of the Related Art

A technique for constructing arithmetic circuitry, using a variable logic unit which is called a Field Programmable Gate Array (EPGA) or a Field Programmable Logic Device (FPLD) is described in JP-A No. 111790/1998. A technique for constructing the EPGA, using electrically rewritable nonvolatile storage elements as its storage cells, the elements being used in an EEPROM and a flash memory, is described in "Interface" pp. 67–68, published by CQ Publishing Co., Ltd. (November 2001).

A nonvolatile memory unit using split-gate-type nonvolatile memory cells is widely used for application in mounting with logical devices on a chip. This split-gate-type nonvolatile memory cell consists of two transistor portions: a memory MOS transistor portion for storing data and a selecting MOS transistor portion for selecting the memory transistor portion and retrieving the data therefrom. As publicly known literature in this relation, the technique hereof is described in the proceedings of the 1994 IEEE, VLSI Technology Symposium, pp. 71–72. The structure and operation of the split-gate-type nonvolatile memory cell will be briefly described. The split-gate-type nonvolatile memory cell is composed of a source, drain, floating gate, and control gate. The floating gate is formed in the memory MOS transistor portion and the gate electrode of the selecting MOS transistor portion makes the control gate. The gate oxide layer of the selecting MOS transistor portion is formed by deposition and functions as an electrically insulating layer between the floating gate and the gate electrode of the selecting MOS transistor. For example, to put the memory cell into the writing state, hot electrons are generated by source side injection and the floating gate is injected with charge. To put the memory cell into the erasure state, the charge retained on the floating gate is discharged from the tip of the floating gate toward the control gate. At this time, it is necessary to apply a high voltage of 12 volts to the control gate. The control gate that functions as a discharging electrode is, in essential, the gate electrode of the selecting MOS transistor portion that is used for selecting a read action.

The present inventors studied mounting a nonvolatile memory unit and a variable logic unit together with other components on a chip.

The purpose of mounting the variable logic unit together with a CPU and other components on a chip is to enable prompt reconfiguration to be performed adaptively to change in hardware specifications and functional change to the CPU and part of the peripheral functions. Moreover, the purpose of mounting the nonvolatile memory unit with the CPU on a chip is to store control program and data for the CPU operation into the on-chip memory so that debugging and program version up for CPU version up can be easily performed. The present inventors pursued the easiness of reconfiguring or upgrading the microcomputer and its peripheral functions by closely associating the variable logic unit with the nonvolatile memory unit. As a result, we discovered that it is important to accomplish quicker read access in both the nonvolatile memory unit and the variable logic unit and provide high reliability of functions to be realized by these units.

Once the variable logic unit is set to perform predetermined logic functions, the logic functions are performed through access to the nonvolatile memory unit and the CPU performs data processing through access to the nonvolatile memory unit. Thus, the nonvolatile memory unit that is applied in a mode that it is mounted with logic devices on a chip is especially required to have quicker read access performance. If the variable logic unit is configured with nonvolatile memory cells as its storage cells, the storage cells to function as switch elements are also required to have quicker read access performance.

In the above-mentioned split-gate-type memory cell structure, the gate electrode of the selecting MOS transistor functions as the electrode for erasure also. Thus, the gate insulation layer of the selecting MOS transistor had to have the same thickness as that of a high-voltage-tolerant MOS transistor for controlling the voltage for writing and erasure in order to assure its withstand voltage. Consequently, Gm (mutual conductance) of the selecting MOS transistor must be low, which makes it hard to obtain a sufficiently great current for reading. It was found that the above split-gate-type memory cell of prior art is not suitable for higher speed operation on a lower voltage with the view of quicker read access performance.

In view of functions to be realized by the nonvolatile memory unit and the variable logic unit, the variable logic unit determines a hardware configuration and the functions to be provided by the configuration are determined or adjusted by using the data stored in the nonvolatile memory unit. Thus, it was found that consideration should be taken to improve both the reliability of the data stored in the nonvolatile memory unit and the reliability of logic constitution definition data to be retained by the variable logic unit.

SUMMARY OF THE INVENTION

It is an object of the present invention is to configure a semiconductor device including a nonvolatile memory unit and a variable logic unit mounted on a chip to achieve higher speed operation on a lower voltage.

It is another object of the present invention is to configure a semiconductor device including a nonvolatile memory unit and a variable logic unit mounted on a chip to achieve high reliability of functions to be realized by these units.

It is a further object of the present invention is to provide a semiconductor device that enables reconfiguring or upgrading a CPU and other peripheral functions mounted thereon easily with a high reliability and can meet requirements of higher speed operation on a lower voltage.

The foregoing and other objects and new features of the invention will be apparent from the description herein and the accompanying drawing.

The advantages to be obtained by a typical semiconductor device provided by the present invention disclosed herein will be summarized below.

According to the invention, a nonvolatile memory cell that essentially has a split gate structure composed of a selecting MOS transistor (second MOS transistor) and a memory MOS transistor (first MOS transistor) is provided. The nonvolatile memory cell is constructed such that the dielectric withstand voltage of the gate of the selecting MOS transistor is lower than that of the memory MOS transistor or the physical or electrical thickness of the gate insulation layer of the selecting MOS transistor is thinner than that of a high-voltage-tolerant MOS transistor (fourth MOS transistor). This makes it possible that the selecting MOS transistor has a high Gm. Because of the high Gm, a sufficiently great current for reading can be obtained and quicker read access to the split-gate-type memory cell can be achieved. A semiconductor device of the invention including a nonvolatile memory unit and a variable logic unit can achieve higher speed operation on a lower voltage.

Current for writing is reduced. Moreover, by using MONOS-type nonvolatile memory cells, the semiconductor device of the invention including a nonvolatile memory unit and a variable logic unit can achieve high reliability of functions to be realized by the nonvolatile memory unit and the variable logic unit.

Furthermore, the semiconductor device of the invention enables reconfiguring or upgrading a CPU and other peripheral functions mounted thereon easily with a high reliability and can meet requirements of higher speed operation on a lower voltage.

The overview of a typical semiconductor device provided by the present invention disclosed herein will be summarized below.

[1] A semiconductor device according to the invention includes a nonvolatile memory unit which comprises a plurality of rewritable nonvolatile memory cells and a variable logic unit whose logical functions are determined in accordance with logic constitution definition data to be loaded into a plurality of storage cells thereof.

Each of the above-mentioned nonvolatile memory cells (NVC) comprises a first MOS transistor (Mtr) for storing data and a second MOS transistor (Str) for selecting the first MOS transistor. In a region of impurities under a section between a gate electrode of the first MOS transistor and a gate electrode of the second MOS transistor, no electrode common for both transistors is provided. These transistors are constructed such that the dielectric withstand voltage of the gate of the second MOS transistor is lower than that of the gate of the first MOS transistor. In another aspect, the thickness of the gate insulation layer of the second MOS transistor is noticed. When one of the above-mentioned nonvolatile memory cells is combined with a third MOS transistor (LMOS) which performs logic operation for memory action to the nonvolatile memory cell and a forth MOS transistor (HVMOS) which handles a voltage required for rewriting the data of the nonvolatile memory cell in the above-mentioned nonvolatile memory unit, gate insulation layers of the second, third, and fourth MOS transistors are formed to have their physical thicknesses fulfilling constraint tL≦ts<tH where ts is the physical thickness of the gate insulation layer of the second MOS transistor, tL is the physical thickness of the gate insulation layer of the third MOS transistor, and tH is the physical thickness of the gate insulation layer of the fourth MOS transistor. The thickness may be regarded as electrical thickness instead of the physical thickness. Thinner electrical thickness means lower dielectric withstand voltage.

The above-mentioned nonvolatile memory cells have a split gate electrode structure that the gate electrode of the first MOS transistor to which a rather high voltage for writing and erasure is applied and the second selecting MOS transistor are separated and a common electrode is not provided in the region of impurities under the section between the separate gate electrodes. In virtue of this structure, a so-called source side injection and writing is accomplished by injection of hot electrons from the second MOS transistor side, the current for writing is reduced by restricting the channel current across the second MOS transistor, and the second MOS transistor can be made low voltage tolerant.

Moreover, the dielectric withstand voltage of the gate of the second selecting MOS transistor is set lower than that of the first MOS transistor which handles a voltage for writing and erasure. Alternatively, the physical or electrical thickness of the gate insulation layer of the second MbS transistor is made thinner than that of the fourth MOS transistor which handles a rather high voltage for rewriting data. This makes it possible that the second MOS transistor has a high Gm. The thickness of the gate insulation layer of the second MOS transistor, if it is made the possible thinnest, can be set equal to the thickness of the corresponding layer of the third MOS transistor that is responsible for logic operation. Because of the high Gm, a sufficiently great current for reading can be obtained and quicker access to the split-gate-type memory cells can be achieved. For reducing the current for writing and quicker read access, the semiconductor integrated circuitry having the nonvolatile memory cells is a promising solution to realizing operation on a lower voltage and quicker read access.

[2] As the storage cells of the above-mentioned variable logic unit, static lathes or nonvolatile memory cells may be used. If the latter is used, a storage cell also serves as a switch cell for selecting a logic constitution. Because the number of elements to constitute the storage is few, the area occupied by the variable logic unit on a chip can be reduced.

The nonvolatile memory cells having the same structure as those used in the above nonvolatile memory unit may be used in the variable logic unit. The variable logic unit using such nonvolatile memory cells is ideal for operation on a lower voltage and contributes to quicker logic operation.

[3] In a specific mode of the foregoing semiconductor device, the first transistor may use a conductive floating gate electrode (for example, a polysilicon gate electrode) covered with an insulation layer as a charge-storing region under its gate electrode. The charge-storing region may be provided by a charge-trapping insulation layer (a silicon nitride layer) covered with an insulation layer or a conductive particles layer covered with an insulation layer. If either of the latter two types of layers is used, its insulation property can effectively prevent leakage of charge stored and high reliability of retaining data can be achieved.

[4] In one preferred specific mode of the foregoing semiconductor device, the concentration of impurities existing in a channel region of the first MOS transistor is set lower than the concentration of impurities existing in a channel region of the second MOS transistor. The concentration of impurities in the channel that determines the threshold voltage of the second selecting MOS transistor, for example, the concentration of p-type impurities, is set thicker (higher) than that of the first MOS transistor so that the threshold voltage of the second MOS transistor will be positive. The concentration of impurities in the channel of the first MOS transistor for storing data, for example, the concentration of p-type impurities, is set lower than that of the second selecting MOS transistor so that the first MOS transistor's threshold voltage during an erasure state will be sufficiently low and a great current for reading can be obtained. If a low supply voltage, for example, 1.8 V is used, the first MOS transistor's threshold voltage during the erasure state can be set negative. When a relatively great variation (for example, 0.7 V) in the threshold voltage of a MOS transistor is considered, the gate electrode (memory gate electrode) of the first MOS transistor can be set at ground potential of the circuit during a read.

[5] The foregoing semiconductor device may be built on a single semiconductor chip. In the alternative, the foregoing semiconductor device may be configured such that the nonvolatile memory unit and the variable logic unit are separately built on different semiconductor chips and the semiconductor chips are mounted on a wiring substrate.

[6] An organic relationship between the nonvolatile memory unit and the variable logic unit is noticed. If the semiconductor device includes a CPU which is connected to the nonvolatile memory unit and the variable logic unit and the storage cells of the variable logic unit are the above-mentioned nonvolatile memory cells, programmed logic constitution definition data may be retained in the nonvolatile memory cells. Moreover, the nonvolatile memory unit may retain a control program for operation of the CPU which uses logical functions set, according to the logic constitution definition data retained in the variable logic unit. In other words, the semiconductor device includes a microcomputer portion which includes a plurality of rewritable nonvolatile memory cells in which a control program for microcomputer operation is stored and a variable logic unit which includes a plurality of rewritable storage cells in which logic constitution definition data is stored, wherein the microcomputer portion and the variable logic unit are programmable.

If the storage cells of the variable logic unit are the above-mentioned static latches, the nonvolatile memory unit may retain logic constitution definition data programmed for the variable logic unit in its nonvolatile memory cells. At the same time, it is preferable that the nonvolatile memory unit retains a transfer control program which is executed by the CPU to load the logic constitution definition data into storage cells of the variable logic unit. Furthermore, the nonvolatile memory unit may retain a control program for operation of the CPU which uses logical functions set, according to the logic constitution definition data loaded into said variable logic unit.

With the advantage that the current for reading is easy to obtain even with operation on a lower voltage, the semiconductor device of the invention can accomplish high reliability of functions to be realized by the nonvolatile memory unit and the variable logic unit mounted on a chip.

BRIEF DESCRIPTION OF THE DRAWINGS

FIG. 5 shows a table of exemplary voltages to be applied to the constituent parts of the nonvolatile memory cell of FIG. 4 in different operation modes and methods to be applied;

FIG. 15 shows a table containing exemplary voltages of the lines and ports of the switch of FIG. 14 as the conditions subject to which the state of the switch is determined;

FIG. 20 is a block diagram illustrating another example of the switch cell;

FIG. 36 is a block diagram illustrating an example of application of the present invention to a semiconductor integrated circuitry called a system LSI of a system-on-chip (SOC) type or the like;

DETAILED DESCRIPTION OF THE PREFERRED EMBODIMENTS

Figure 1:
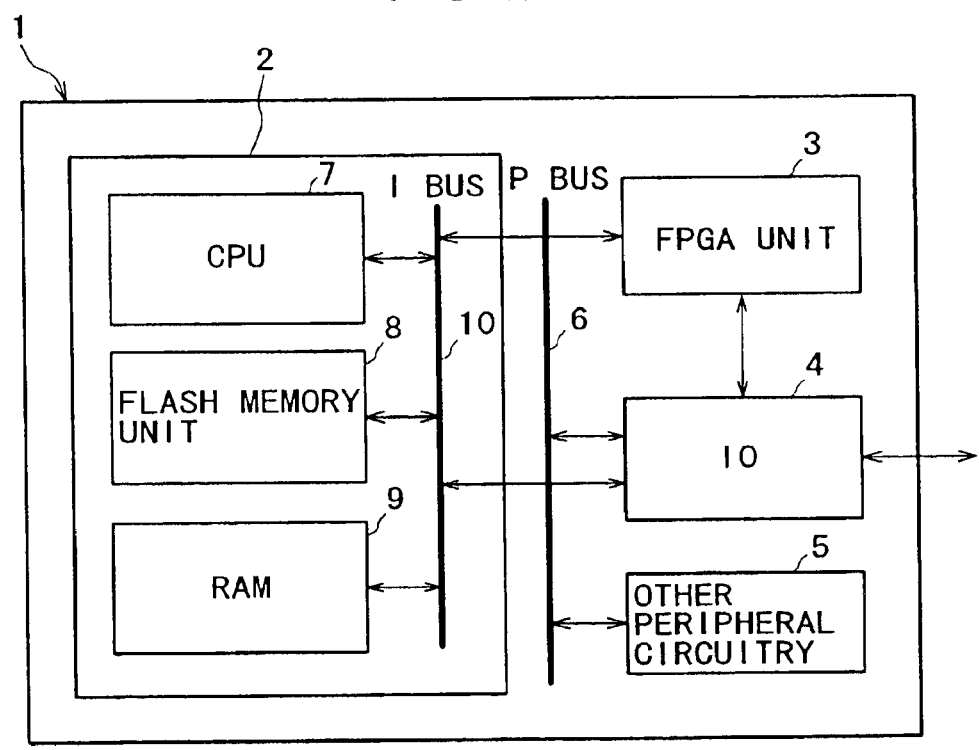
FIG. 1 is a block diagram illustrating an example of semiconductor integrated circuitry according to one embodiment of the present invention.

FIG. 1 illustrates an example of semiconductor integrated circuitry according to one embodiment of the present invention. On a single semiconductor substrate (semiconductor chip) made of material which is, for example, but not limited to, monocrystalline silicon, the semiconductor integrated circuitry 1 shown in FIG. 1 is constructed by CMOS integrated circuit fabrication technique. The semiconductor integrated circuitry 1 comprises, for example, a microcomputer portion (which is also referred to as a processor portion) 2, an FPGA unit 3 as a variable logic unit, input/output circuitry (I/O) 4, other peripherals circuitry 5, and peripheral bus (P bus) 6. The above microcomputer portion 2 comprises a Central Processing Unit (CPU) 7, a flash memory unit 8 as a nonvolatile memory unit, and a Random Access Memory (RAM) 9 and all these constituent parts are connected to a common internal bus (I bus) 10. The peripherals circuitry 5 is connected to the P bus 6 and the I/O 4 is connected to the P bus 6 and the I bus 10. The I/O 4 interfaces with an external bus and external peripherals circuits which are not shown. The above FPGA unit 3 is connected to I bus 10 and the I/O 4. The above other peripherals circuitry 5 has components including but not limited to timers, counters, etc.

The above I bus 10 and P bus 6 have signal lines for address, data, and control signals. The CPU7 has an instruction control part and an instruction execution part, interprets a fetched instruction, and performs arithmetic processing, according to the interpreted instruction. The flash memory unit 8 stores a control program for the CPU 7 operation and related data. The RAM 9 is used by the CPU 7 as a working area or a temporary storage area for data. The flash memory unit 8 is controlled, based on a command issued by the CPU 7 to it.

The FPGA unit 3 is constructed based on a circuitry concept called a Field Programmable Gate Array (FPGA) or a Programmable Logic Device (PLD). In a broad sense, the FPGA unit 3 comprises means for programmably switching line connections and means (storage cells) for retaining switching instructions data. Logic functions are determined, according to logic constitution definition data that is loaded into the storage cells. As the storage cells, static latches of a Static Random Access Memory (SRAM), nonvolatile memory cells of an anti-fuse flash memory, and the like can be used. In the broadest concept of the present invention, it does not matter whatever constitution of the storage cells is. In a preferred embodiment of the invention, rewritable nonvolatile memory cells are used.

The flash memory unit 8 of the microcomputer portion 2 comprises rewritable nonvolatile memory cells to store a part or all of the control program for operating the CPU 7 or control data.

Writing data into (rewriting the existing data on) the flash memory unit 8 can be performed in two modes: one mode in which data received from an external writing device via the I/O is directly written to it 4; another mode in which the CPU executes a rewrite control program rewriting to write externally supplied data to it. Either mode can be selected for use. Setting logic constitution definition data held by the FPGA unit 3 can be performed in several modes. If the storage cells of the EPGA are static latches, one of the following modes can be taken: a mode in which logic constitution definition data received from the external via the I/O 4 is directly set held by the latches; a mode in which the CPU 7 executes a transfer control program to set externally supplied logic constitution definition data held by the latches; and a mode in which the CPU executes the transfer control program by which logic constitution definition data retained in the flash memory unit 8 is set held by the latches. The above transfer control program may be retained in the flash memory unit 8. If the above storage cells are nonvolatile memory cells, either of the following modes can be taken: a mode in which logic constitution definition data received from an external writing device via the I/O 4 is directly written into the cells; and a mode in which the CPU 7 executes a function setting control program to write externally supplied data to write into the cells. The above function setting control program may be retained in the flash memory unit 8. Furthermore, the flash memory unit 8 may retain the control program for the CPU 2 operation using the logic functions held by the EPGA unit 3.

In a preferred embodiment of the semiconductor integrated circuitry of FIG. 1, nonvolatile memory cells of split gate structure are used as the nonvolatile memory cells of the flash memory unit 8 and the EPGA unit. A nonvolatile memory cell of split gate structure comprises, for example, a selection MOS transistor and a memory transistor that is a metal oxide nitride oxide semiconductor (MONOS) type, which will be fully described later. The nonvolatile memory cell of this structure stores data, depending on whether it has charge injected into the trap of the nitride layer or whether or not the quantity of the charge is sufficient.

Figure 2:
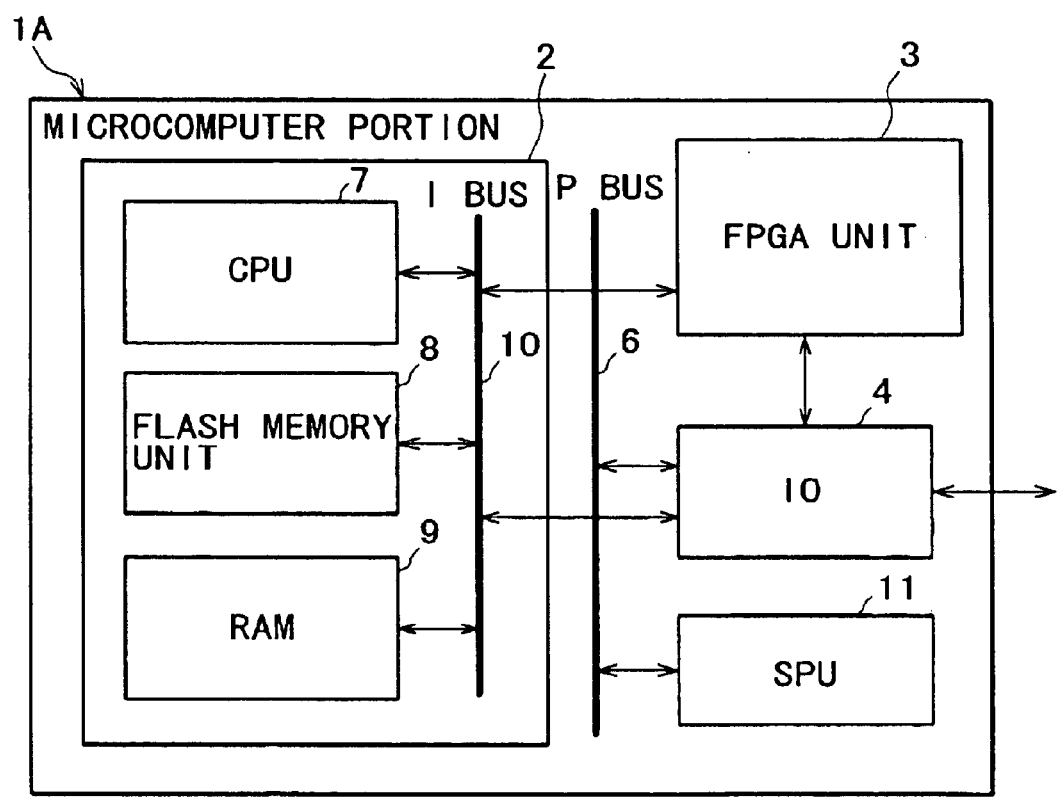
FIG. 2 is a block diagram illustrating another example of semiconductor integrated circuitry according to one embodiment of the present invention.

FIG. 2 illustrates another example of semiconductor integrated circuitry according to one embodiment of the present invention. The semiconductor integrated circuitry 1A shown in FIG. 2 includes a sub-processor (SPU) 11 connected to the I bus 10 in addition to the constituent parts of the circuitry of FIG. 1. The sub-processor 11 is assumed a special-purpose processor such as a processor for digital signal processing or a floating-point arithmetic unit. MONOS-type nonvolatile memory cells are used as the memory cells of the flash memory unit 8 and the EPGA unit 3. By virtue of the sub-processor SPU 11, the arithmetic control processing of the CPU 7 is speeded up.

Figure 3:
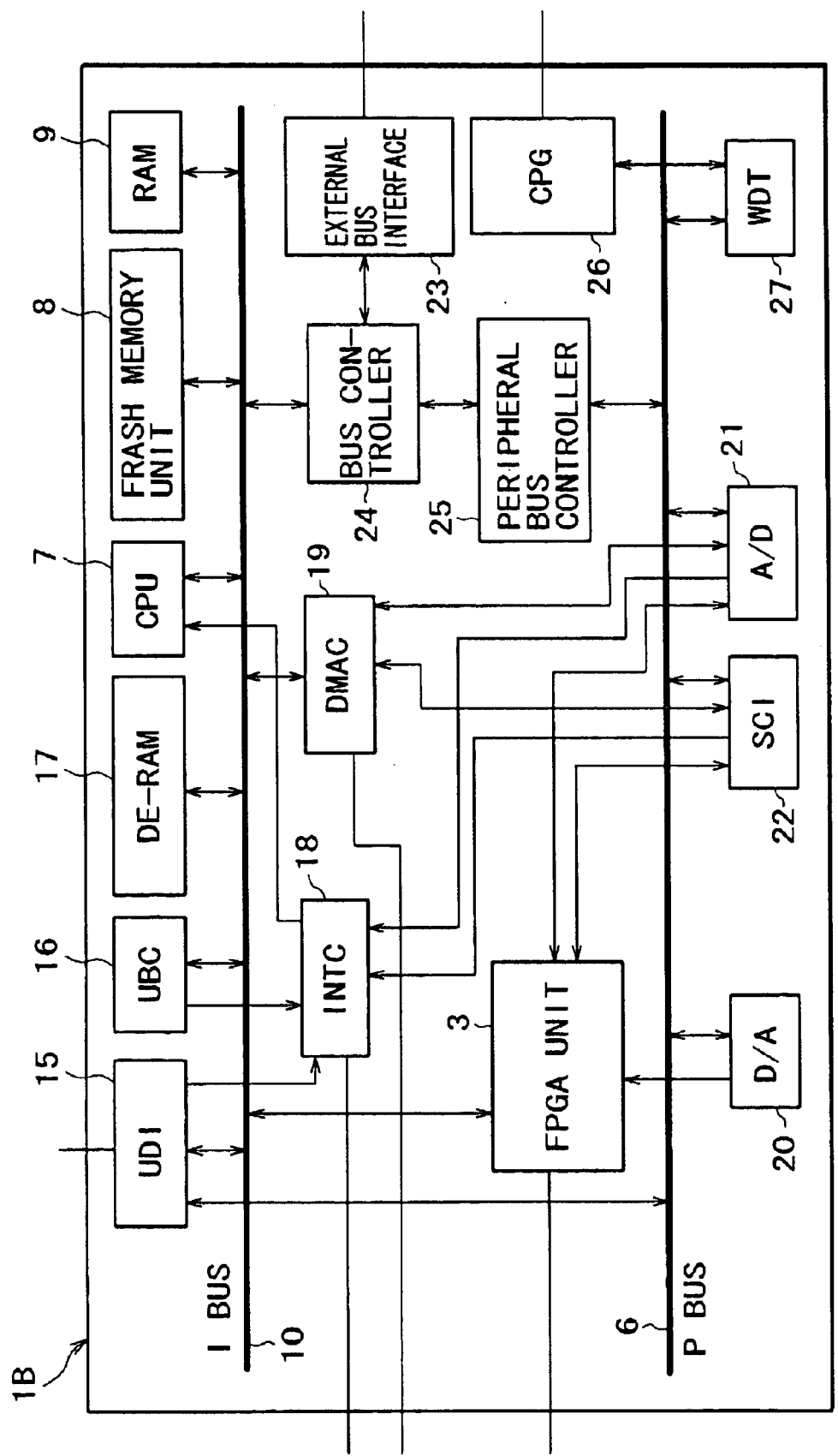
FIG. 3 is a block diagram illustrating a more specific example of semiconductor integrated circuitry using MONOS-type nonvolatile memory cells as the memory cells of a flash memory unit and an EPGA unit included in the semiconductor integrated circuitry of the present invention.

FIG. 3 illustrates a more specific example of the semiconductor integrated circuitry using the MONOS-type nonvolatile memory cells as the memory cells of the flash memory unit 8 and the EPGA unit 3. The semiconductor integrated circuitry 1B shown in FIG. 3 is assumed the LSI for multimedia processing, having peripheral modules. The use of the MONOS-type nonvolatile memory cells in the flash memory unit 8 and the FPGA unit 3 enables reducing the mounting area, operation on a lower voltage (for example, operation at 1.5 V) and programmable function setting in both software and hardware.

A user debug interface (UDI) 15 is an input/output circuit allowing the user to perform debugging and connected to a debugging system which is not shown. A user break controller (UBC) 16 is a controller for breakpoint control during a system debug. A DE-RAM 17 is a RAM that is used as an emulation memory or the like during a debug. These components as well as the CPU 7, the flash memory unit 8 comprising MONOS-type nonvolatile memory cells, and the RAM 9 are connected to the I bus 10. An interrupt controller (INTC) 18 controls interrupts of the CPU 7. A direct memory controller (DMAC) 19 exerts memory access control on behalf of the CPU 7. The FPGA unit 3 comprising MONOS-type nonvolatile memory cells as storage cells is connected to the I bus 10. D/A 20 is a digital-to-analog signal converter and A/D 21 is an analog-to-digital signal converter. SCI 22 is a serial interface circuit forming one part of the input/output circuitry. An external bus interface 23 is an input/output circuit for interfacing with an external bus and connected to the I bus 10 via a bus controller 24. The bus controller 24 is connected to the P bus 6 via a peripheral bus controller 25. A clock pulse generator (CPG) 26 generates internal reference clock signals. A watchdog timer (WDT) 27 watches out for runway of the CPU 7.

In the semiconductor integrated circuitry 1B shown in FIG. 3, by writing the control program for the CPU 7 operation into the flash memory unit 8, making the CPU 7 execute the program, and setting functions definition data held by the FPGA unit, the operation of the circuitry can be tailored to implement desired logic functions. The FPGA unit 3 may be set having data for implementing specific peripheral functions or for functioning as an accelerator for the CPU 7. Because the circuitry has two programmable units, namely, the FPGA unit 3 and the flash memory unit 8, it features flexibility in setting functions. Because both units 3 and 8 use MONOS-type nonvolatile memory cells of split gate structure, which will be fully described later, the circuitry is able to operate at higher speed and reduced mounting area is achieved.

Figure 4:
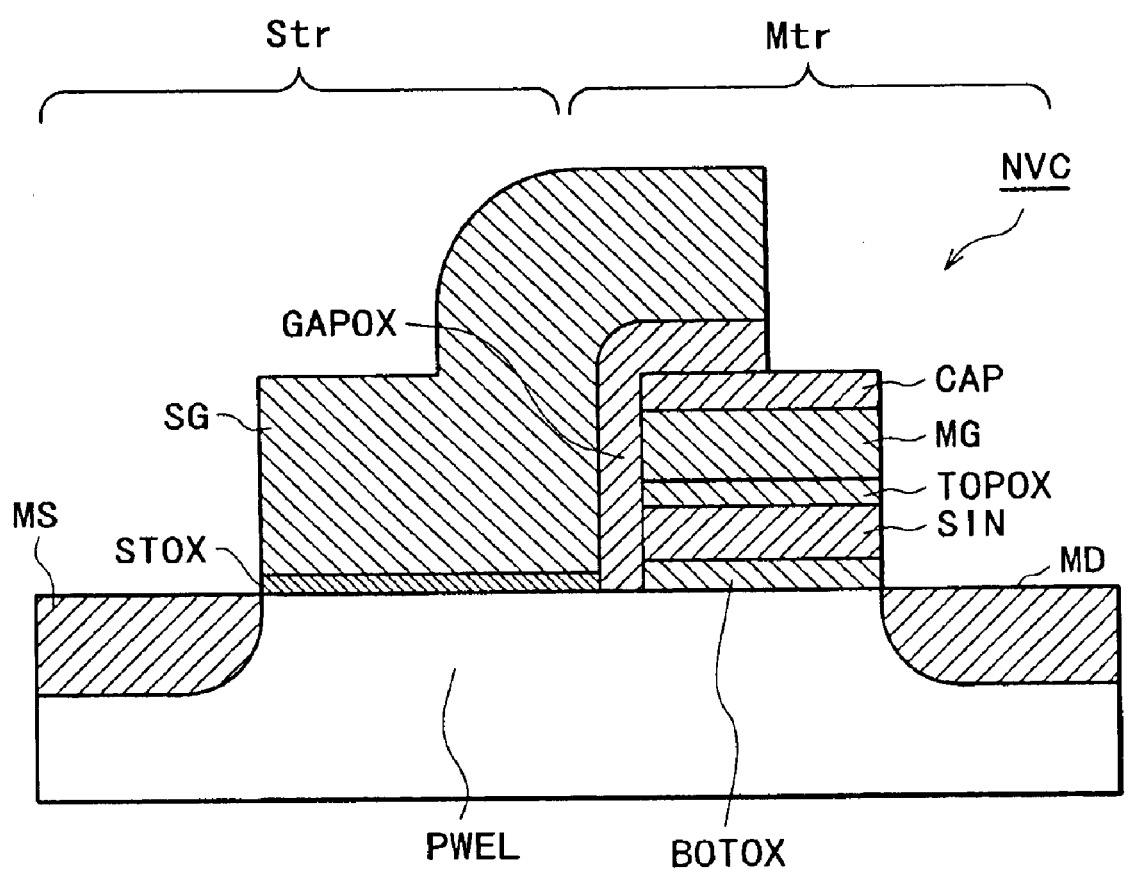
FIG. 4 is a memory cell cross section illustrating an example of a MONOS-type nonvolatile memory cell using a charge-trapping insulation layer, which is used as a nonvolatile memory cell of the above flash memory unit and EPGA unit.

FIG. 4 illustrates an example of a MONOS-type nonvolatile memory cell using a charge-trapping insulation layer, which is used as the above-mentioned nonvolatile memory cell.

The nonvolatile memory cell NVC consists of a memory MOS transistor (a first MOS-type transistor) Mtr which is used to store data and a selecting MOS transistor (a second MOS-type transistor) Str which selects the memory MOS transistor Mtr. Specifically, the memory cell is composed of a p-type well region PWEL made on a silicon substrate, an n-type diffusion layer MS which makes a source region, an n-type diffusion layer MD which makes a drain region, a silicon nitride layer SIN as the charge-trapping insulation layer of the memory MOS transistor Mtr, an oxide layer BOTOX directly under the SIN layer, an oxide layer TOPOX directly over the silicon nitride layer SIN, a memory gate electrode MG (its material is, for example, n-type polysilicon) for applying a rather high voltage required for writing or erasing data to/from the cell, an oxide layer CAP for protecting the memory gate electrode MG, a gate oxide layer STOX of the selecting MOS transistor Str, a selecting gate electrode SG made of n-type polysilicon, and an insulation layer GAPOX which insulates the selecting gate electrode SG from the memory gate electrode MG. The gate oxide layer STOX is made so that its thickness is thinner than the insulation layer GAPOX and thinner than the corresponding layer of a high-voltage-tolerant MOS transistor for writing and erasure. The gate oxide layer STOX and the insulation layer GAPOX are formed through separate processes of separate layers. In the well region PWEL positioned under the insulation layer GAPOX between the selecting gate electrode SG and the memory gate electrode MG, there are no impurities region and electrode like the diffusion layers MD and SD which correspond to the drain region and the source region, respectively.

The thickness of the nitride layer SIN should be 50 nanometers or below. Given that the thickness of the oxide layer TOPOX is tT and the thickness of the oxide layer BOTOX is tB, set tT and tB to fulfill constraint tB>tT if the stored charge is drawn through the oxide layer TOPOX or constraint tB<tT if the stored charge is drawn through the oxide layer BOTOX. While the silicon nitride layer is used as the charge-trapping insulation layer that is as the charge-storing layer in the memory cell example illustrated in FIG. 4, an insulating trap layer of other material such as, for example, alumina, may be used.

FIG. 5 shows a table of exemplary voltages to be applied to the constituent parts of the nonvolatile memory cell illustrated in FIG. 4 in different operation modes and methods to be applied. Here, charge injection into the silicon nitride layer SIN is defined as writing (program). The applied writing method is source side injection of hot electrons. Voltage Vd to be applied to the drain region MD is set at 5 V, voltage Vmg to be applied to the memory gate electrode MG is set at 10 V, and Vsg to be applied to the gate electrode SG of the selecting MOS transistor Str is set approximately equal to the threshold voltage (~Vt) of the transistor. When these voltages are applied, hot electrons are generated in a channel section within the well region PWEL positioned under the insulation layer GAPOX between the two gate electrodes SG and MG. On one side of the channel section, a channel extending from the source region MS remains at 0 V; whereas, on the other side of the channel section, a channel extending from the drain region MD has a voltage of 5 V. At the gap between the above two channels, an intensive electric field takes place, by which hot electrons are generated from the source side and injected into the silicon nitride layer SIN. Because the voltage Vsg applied to the gate electrode SG of the selecting MOS transistor Str is approximately equal to the threshold voltage (~Vt) of the transistor and the channel current is restrained to be low, writing can be done with a small current. Because the gate electrode SG is isolated from the memory gate electrode MG and a high voltage is not applied to it, the selecting MOS transistor Str can be made low voltage tolerant.

In erasure mode with discharge toward the memory gate electrode MG, the voltage Vmg to be applied to the memory gate electrode MG is set at 12 V. This voltage setting applies when the oxide layer BOTOX is thicker than the oxide layer TOPOX. When erasure is performed with discharge toward the p-type well region PWEL, the voltage Vmg to be applied to the memory gate electrode MG is set at −12 V. This voltage setting applies when the oxide layer BOTOX is thinner than the oxide layer TOPOX. The absolute value of 12 V as the voltage to be applied for erasure is exemplary and this value is not to be considered limiting of the scope of the present invention.

If the core logic such as the CPU mounted with the FPGA and flash memory units on a chip operates on a voltage of 1.8 V and if voltage is applied to the source and drain for reading in the reverse direction to the direction of voltage application when writing, the voltage Vd to be applied to the drain region MD is set at 0 V, the voltage Vs to be applied to the source region MS is set at 1.8 V, and the voltage Vsg to be applied to the gate electrode SG is set at 1.8 V. At this time, if the threshold voltage of the memory MOS transistor Mtr in the erasure state is set sufficiently lower than 0, reading can be done with the voltage Vmg of 0 V that is applied to the memory gate electrode MG. In a mode of reading in the forward direction, the voltage Vd to be applied to the drain region MD should be set at 1.8 V and the voltage Vs to be applied to the source region MS should be 0 V. In addition to the core logic such as the CPU, MOS transistors for I/O 4 which handle input/output signals from/to the external are mounted with the FPGA and flash memory units on the same chip. These transistors handle a higher voltage than for the core logic, for example, 3.3 V or 2.5 V. The thickness of the gate insulation layer of these MOS transistors for I/O 4 is thinner than the insulation layer GAPOX; it is about 8 nanometers if 3.3 V is applied and about 6 nanometers if 2.5 V is applied. It may be possible to apply the above-mentioned thickness as the thickness of the gate oxide layer STOX because it is thinner than the insulation layer GAPOX that requires a high dielectric withstand voltage. Voltage to be applied for reading may be 1.8 V that was mentioned above or either 3.3 V or 2.5 V which is for the I/O 4.

Figure 6:
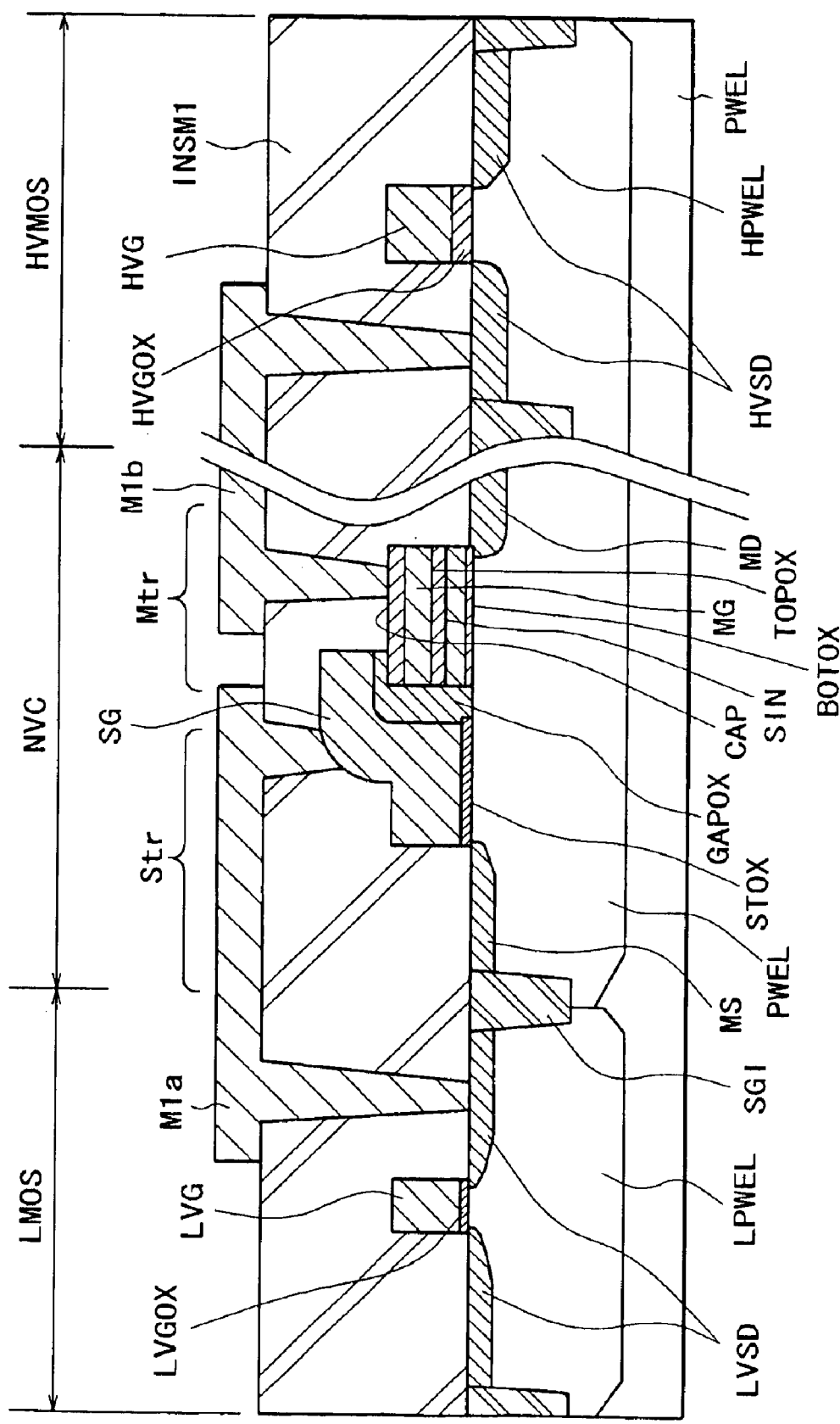
FIG. 6 is a cross section illustrating the section of a fractional structure composed of the nonvolatile memory cell of FIG. 4 and other MOS transistors which are mounted together with the memory cell on a chip.

FIG. 6 illustrates the section of a fractional structure composed of the nonvolatile memory cell NVC of FIG. 4 and other MOS transistors which are mounted together with the NVC on a chip. In FIG. 6, the NVC is the above-mentioned nonvolatile memory cell, HVMOS is a high-voltage-tolerant MOS transistor which handles a rather high voltage required for rewriting the data of the nonvolatile memory cell, and LVMOS is a logical MOS transistor which performs logic operation for memory action to the nonvolatile memory cell. The logical MOS transistor LMOS is assumed the same as a MOS transistor component of core logic such as the CPU 2.

In FIG. 6, SGIs are separation regions between elements. The logical MOS transistor LMOS, which is typical of logical elements, is constructed on a p-type well LPWEL for a n-MOS transistor for core logic (Core Logic MOS), having its gate oxide layer LVGOX, gate electrode LMOS, and source and drain regions LVSD.

The high-voltage-tolerant MOS transistor for writing and erasure HVMOS is constructed on a p-type well HPWEL, having its gate oxide layer HVGOX, gate electrode HVG, and source and drain regions HVSD.

INSMI is an insulation layer between wiring layers. On a first wiring layer, there are a wiring conductor M1$a$ for supplying a low voltage output from the logical MOS transistor LMOS to the selecting gate electrode SG and a wring conductor M1$b$ for supplying a rather high voltage output from the high-voltage-tolerant MOS transistor for writing and erasure HVMOS to the memory gate electrode MG. Actually, upper layers of wiring exist, which are not shown here.

Assuming that all the above-mentioned gate oxide layers STOX, LVGOX, HVGOX, and BOTOX are silicon oxide layers, if their physical thicknesses are defined as ts, tL, tH, and tB, respectively, these gate oxide layers are formed, fulfilling constraint tL<ts<tB<tH in the semiconductor integrated circuitry according to the present invention. Although the section of a MOS transistor for I/O 4 is not shown in FIG. 6, if the thickness of its gate insulation layer is defined as tIO, constraint tL<tIO<tB would be fulfilled. In some embodiments, it is preferable that the thickness ts be set equal to the thickness tIO; even if this is applied, the above gate oxide layers remain fulfilling the above constraint tL<ts<tB<tH. If these layers include non-silicon oxide layers, for example, nitride layers are used as part of them; the above constraint of their thicknesses can be generalized in terms of electrical layer thickness instead of physical layer thickness. The reason why this is possible is that the structure and thickness of a gate insulation layer is set to withstand the voltage to be applied to it. In this view, the layer thicknesses of all electrical constituents of a cell should be set.

In the above-described nonvolatile memory cell NVC of split gate structure, which is also shown in FIG. 6, the gate electrode SG is isolated from the memory gate electrode MG and a high voltage is not applied to it as noted above. Accordingly, the selecting MOS transistor Str can be made low voltage tolerant. Thus, the selecting gate electrode SG and the source and domain regions LVSD of the MOS transistor for core logic LMOS are connected directly by the wiring conductor M1a. Besides, the memory gate electrode MG and the source and drain regions HVSD of the MOS transistor for writing and erasure HVMOS are connected directly by the wiring conductor M1b. Because of the above isolation, the physical or electrical thickness of the gate insulation layer STOX of the selecting MOS transistor Str is made thinner than that of the high-voltage-tolerant MOS transistor HVMOS as noted above. This makes it possible that the selecting MOS transistor Str has a high Gm. The thickness of the gate insulation layer STOX of the selecting MOS transistor Str, if it is made the possible thinnest, can be set equal to the thickness of the corresponding layer of the MOS transistor for logic LMOS that is responsible for logic operation. The high Gm enables the nonvolatile memory cell NVC to carry a sufficiently great current for reading data from the cell NVC. Quicker read access to the split-gate-type memory cell NVC can be achieved. For reducing the current for writing and quicker read access, the semiconductor integrated circuitry having the flash memory unit 8 is a promising solution to realizing operation on a lower voltage and quicker read access.

Figure 7:
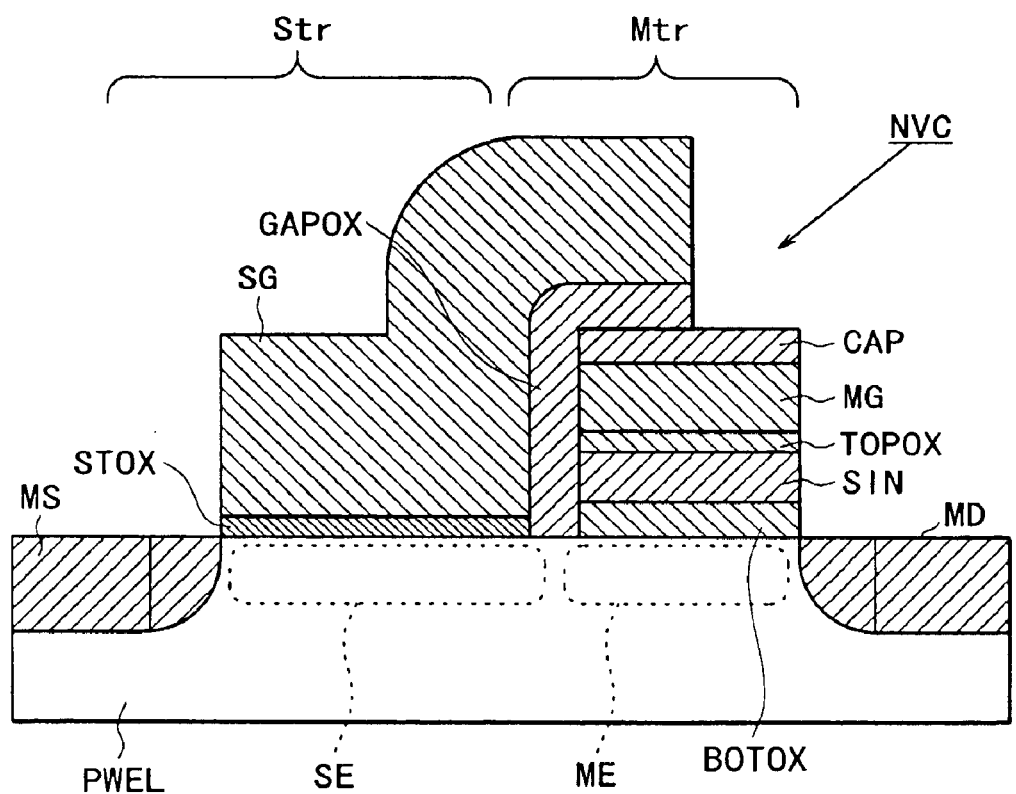
FIG. 7 is a diagram for explaining difference in the concentration of impurities in a channel between a selecting MOS transistor and a memory MOS transistor in the nonvolatile memory cell of FIG. 4.

FIG. 7 is provided for explaining difference in the concentration of impurities in a channel between the selecting MOS transistor Str and the memory MOS transistor Mtr in the nonvolatile memory cell NVC of FIG. 4. Possible lower threshold voltage of a MOS transistor is desirable to carry a great current for reading with a low voltage. However, if the threshold voltage of the selecting MOS transistor Str is too low, the transistor does not become off completely even if the gate voltage is 0. The resulting leak current affects normal read action. Thus, the threshold voltage of the selecting MOS transistor Str should be low in the positive range. On the other hand, the threshold voltage of the memory MOS transistor Mtr must be sufficiently low to carry a great current for reading. It is desirable to set the voltage of the memory gate electrode MG at 0 during a read in order to enable long storage of charge. On condition that no leak occurs in the selecting MOS transistor Str, therefore, the threshold voltage of the memory MOS transistor Mtr in the erasure state should be set negative.

For a conventional floating gate, a sufficiently low threshold voltage can be obtained by setting a rather high voltage for erasure or applying the voltage for erasure for a long period. However, the memory cell NVC using the charge-trapping insulation layer as embodied in the present embodiment has the characteristic that the threshold voltage does not decrease below a given value. Therefore, to decrease the threshold voltage of the memory MOS transistor Mtr, its intrinsic threshold voltage must be set low by adjusting the impurities concentration in the channel. Due to the above-noted difference in transistor-intrinsic threshold voltages, inevitably, the impurities concentration in the channel region SE of the selecting MOS transistor Str and the impurities concentration in the channel region ME of the memory MOS transistor Mtr must be set different from each other. In the case of the memory cell NVC constructed on the p-type well region PWEL as shown in FIG. 7, set p-type impurities concentration Nse in the channel region SE and p-type impurities concentration Nme in the channel region ME to fulfill constraint Nse>Nme by comparison of both. Difference between both impurities concentrations realizes the feature of the memory cell carrying a great current for reading at a low voltage from another perspective.

Figure 8:
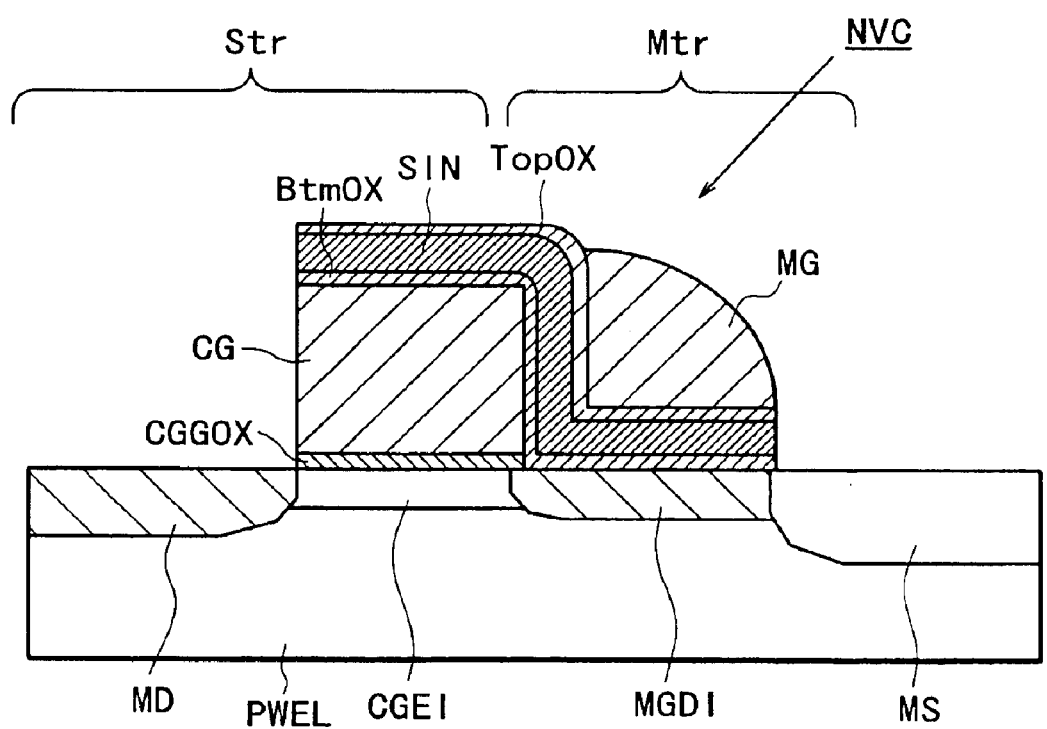
FIG. 8 is a memory cell cross section illustrating another example of a MONOS-type nonvolatile memory cell having structure in which the nitride layer of the memory cell transistor extends over the selecting transistor.

FIG. 8 illustrates another example of a MONOS-type nonvolatile memory cell. The nonvolatile memory cell of FIG. 8 has structure in which the nitride layer of the memory MOS transistor Ttr extends over the selecting MOS transistor Str. In FIG. 8, PWEL is the p-type well region; CGEI is an impurities layer to adjust the gate CG of the selecting MOS transistor Str, making it enhanced (making the threshold voltage of the MOS transistor Str positive); and MGDI an impurities layer to adjust the gate electrode MG of the memory MOS transistor Mtr, making it depressed (making the threshold voltage of the MOS transistor Mtr negative). MD is the n-type drain region; MS is the n-type source region; CGGOX is the gate oxide layer of the selecting MOS transistor Str; and CG is its gate electrode. RtmOX is a bottom oxide layer (O) which is a constituent of ONO; SiN is a silicon nitride layer (N) which is a constituent of ONO; TopOX is a top oxide layer (O) which is a constituent of ONO; and MG is the gate electrode of the memory MOS transistor Mtr.

Figure 9:
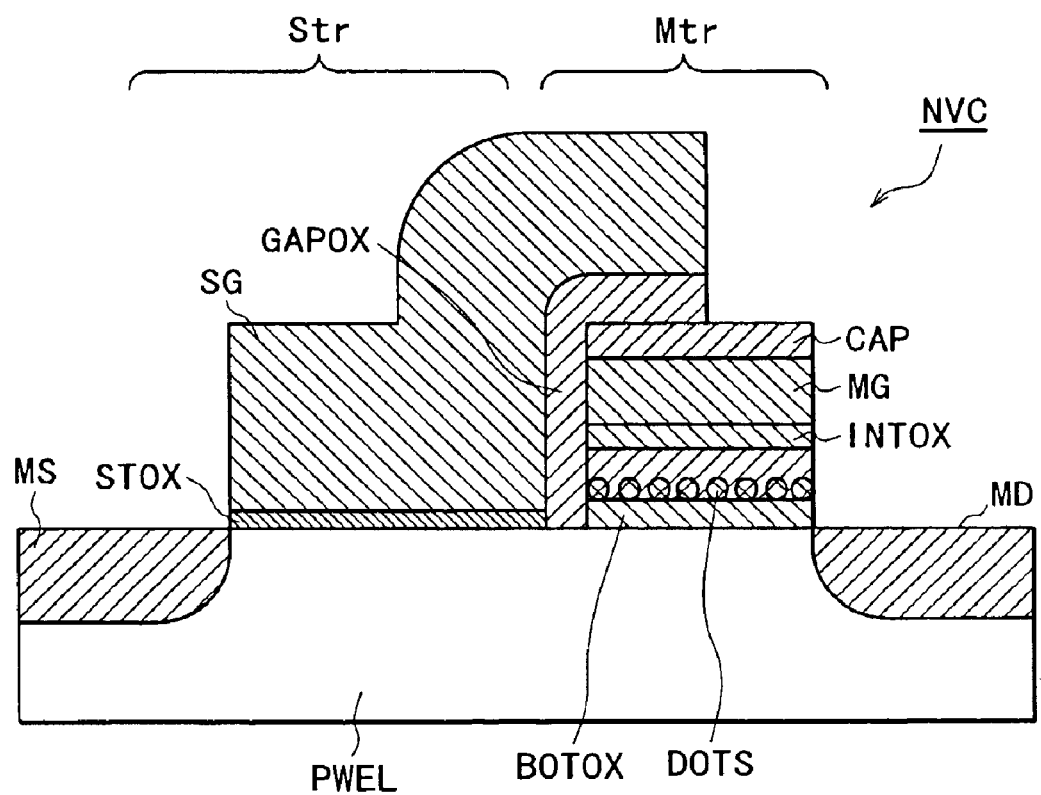
FIG. 9 is a memory cell cross section illustrating a nonvolatile memory cell using minute conductive particles in its charge-storing portion.

FIG. 9 illustrates a nonvolatile memory cell using minute conductive particles in its charge-storing portion. The particles DOTS are placed on the underlying oxide layer BOTOX. The material of the particles DOTS may be polysilicon and other suitable materials. Desirably, the diameter of a particle should be 10 nanometers or below. An interlaid insulation layer INTOX is put to cover the particles DOTS and the memory gate electrode MG is put on the INTOX layer. The charge-storing portion that consists of discrete particles to be charged is to be considered equivalent to the charge-storing layer that traps charge.

Figure 10:
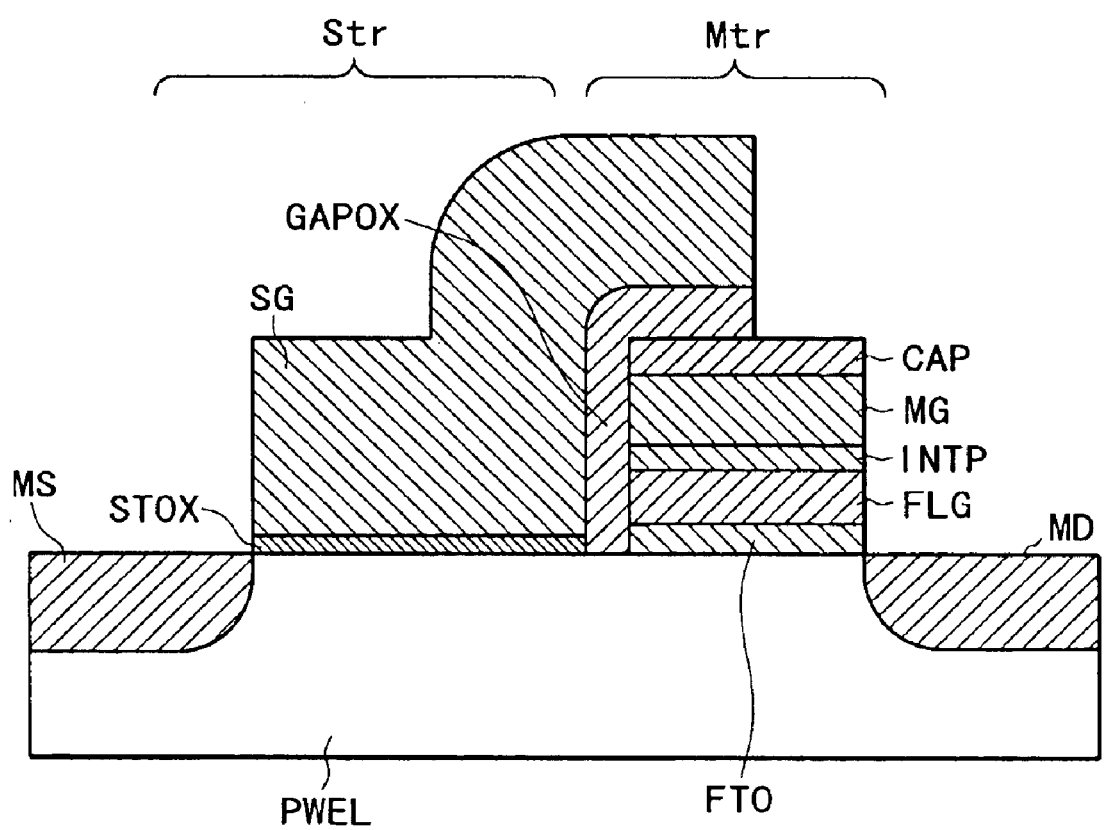
FIG. 10 is a memory cell cross section illustrating a nonvolatile memory cell using a conductive floating gate electrode covered with an insulation layer in its charge-storing portion.

FIG. 10 illustrates a nonvolatile memory cell using a conductive floating gate electrode covered with an insulation layer in its charge-storing portion. The charge-storing portion consists of a floating gate FLG, a tunnel oxide layer FTO, and an interlaid insulation layer INTP. The interlaid insulation layer INTP may be embodied by a generally used lamination of silicon oxide, silicon nitride, and silicon oxide layers.

As is apparent from the above illustrations, the nonvolatile memory cell NVC having the split gate MONOS structure features the formations of the gate insulation layers with their thicknesses fulfilling the above-mentioned constraint tL<ts<tH. These memory cells enable quicker reading with a low voltage and reduction in the current for writing. Consequently, the power supply circuit portion can be downsized and the area occupied by it can be reduced. By incorporating the flash memory unit 8 and the FPGA unit 3 constructed, using these nonvolatile memory cell NVCs, into semiconductor integrated circuitry on a chip, hardware functions to be set by the FPGA unit 3 and software functions to be set by writing programs and control data into the flash memory unit 8 can be configured in an organically linked manner and functions meeting diverse user needs can be realized. Besides, higher speed processing can be achieved and user-customized functions can be realized on a relatively small chip, making it feasible to curtail costs. Furthermore, by using the charge-trapping insulation layer or the conductive particles layer in the MONOS structure, unwanted leak of charge can be prevented (the strength to withstand writing is enhanced) and high reliability of logic functions that are realized by the flash memory unit 8 and the FPGA unit 3 can be ensured.

Figure 11:
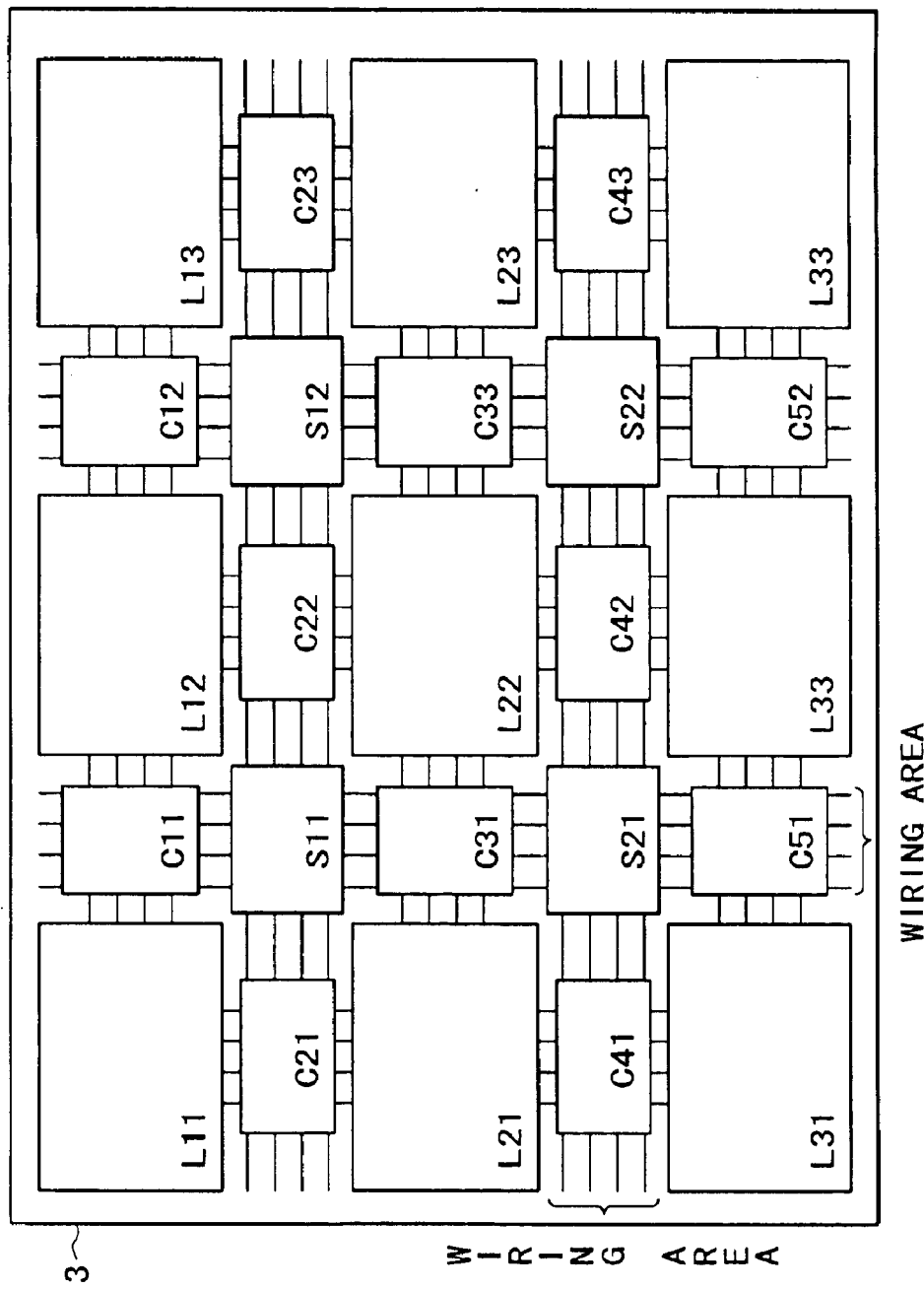
FIG. 11 is a block diagram illustrating an example of the FPGA unit.

FIG. 11 illustrates an example of the above-mentioned FPGA unit 3. The FPGA unit 3 is composed of a plurality of logic cells L11 to L33, connection cells C11 to C52, and switch cells S11 to S22 which are arranged in a matrix. The logic cells L11 to L33, connection cells C11 to C52, and switch cells S11 to S22 each include the above-described MONOS-type memory cells NVCs. Desired functions can be set by writing/erasing data into/from the memory cells. For example, the logic cells L11 to L33 can be set programmably to perform logical functions such as NOR and NAND. The connection cells C11 to C52 can be set programmably to make wiring connections to the corresponding logic cells L11 to L33. The switch cells S11 to S22 can be set programmably to make connections of wiring lines.

Reading on a low voltage can be performed by using the nonvolatile memory cells NVCX having the split gate MONOS structure which features the formations of the gate insulation layers with their thicknesses fulfilling the above-mentioned constraint $tL \leq ts < tH$. For example, when a fabrication process of generations applying a 0.18 $\mu$m rule is used, power supply of 1.5 V enables not only logic circuits to operate, but also reading data from the flash memory. Although control circuits for writing and erasure and a power supply circuit are not shown in FIG. 11, the current for writing can be reduced as noted above and, accordingly, the power supply circuit can be downsized. Reduction of the area occupied by the chip is achieved.

Figure 12:
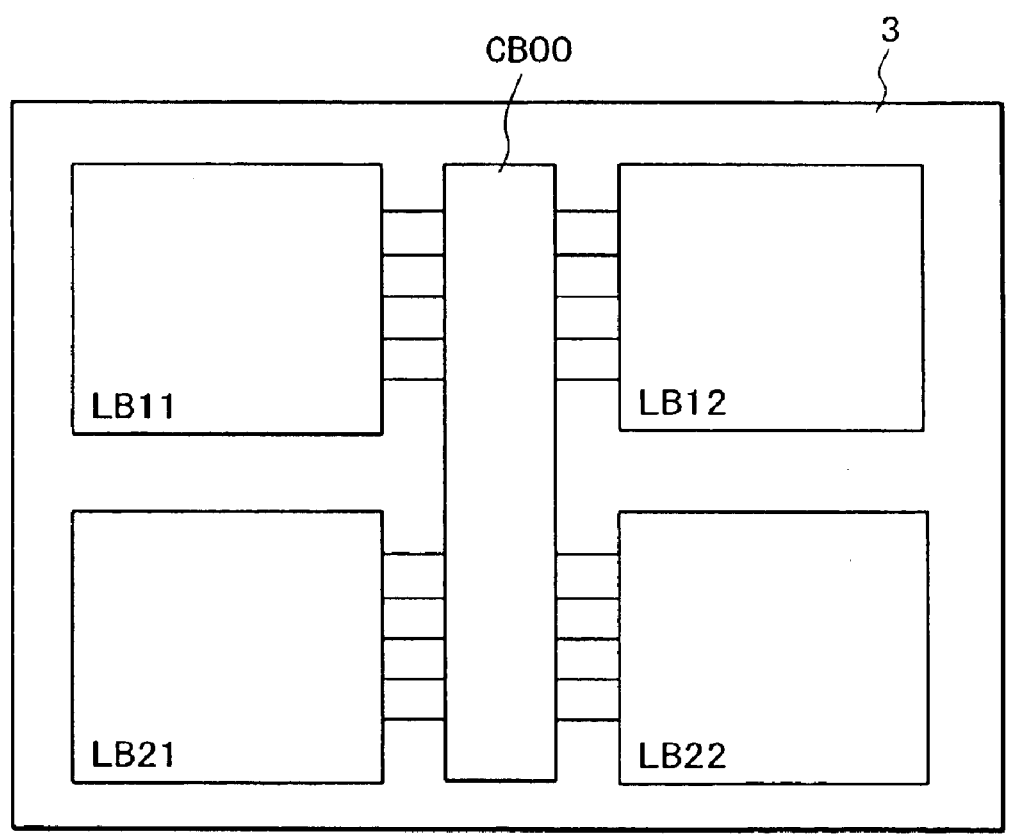
FIG. 12 is a block diagram illustrating another example of the FPGA unit.

FIG. 12 illustrates another example of the FPGA unit 3. The FPGA unit 3 is composed of logic blocks LB11 to LB22 and lines interconnection block CB00. The logic blocks LB11 to LB22 and lines interconnection block CB00 each include the above-described MONOS-type nonvolatile memory cells NVCX. Desired functions can be set by writing/erasing data into/from the memory cells. The logic blocks LB11 to LB22 can be set programmably to perform logical functions such as registers and arithmetic and logic units. The lines interconnection block CB00 can be set programmably to interconnect functional circuits set for the logic blocks LB11 to LB22. This structure corresponds to a structure generally called Complicated Programmable Logic Device (CPLD). Wiring lines concentrate to the programmable lines interconnection block and the merit hereof is that wiring delay is little and approximately constant.

The EPGA unit embodiment of FIG. 12, as is the case for that of FIG. 11, also enables reading on a low voltage by using the nonvolatile memory cells NVC having the split gate MONOS structure which features the formations of the gate insulation layers with their thicknesses fulfilling the above-mentioned constraint $tL < ts < tH$. Consequently, reduction of the area occupied by the chip is achieved.

Figure 13:
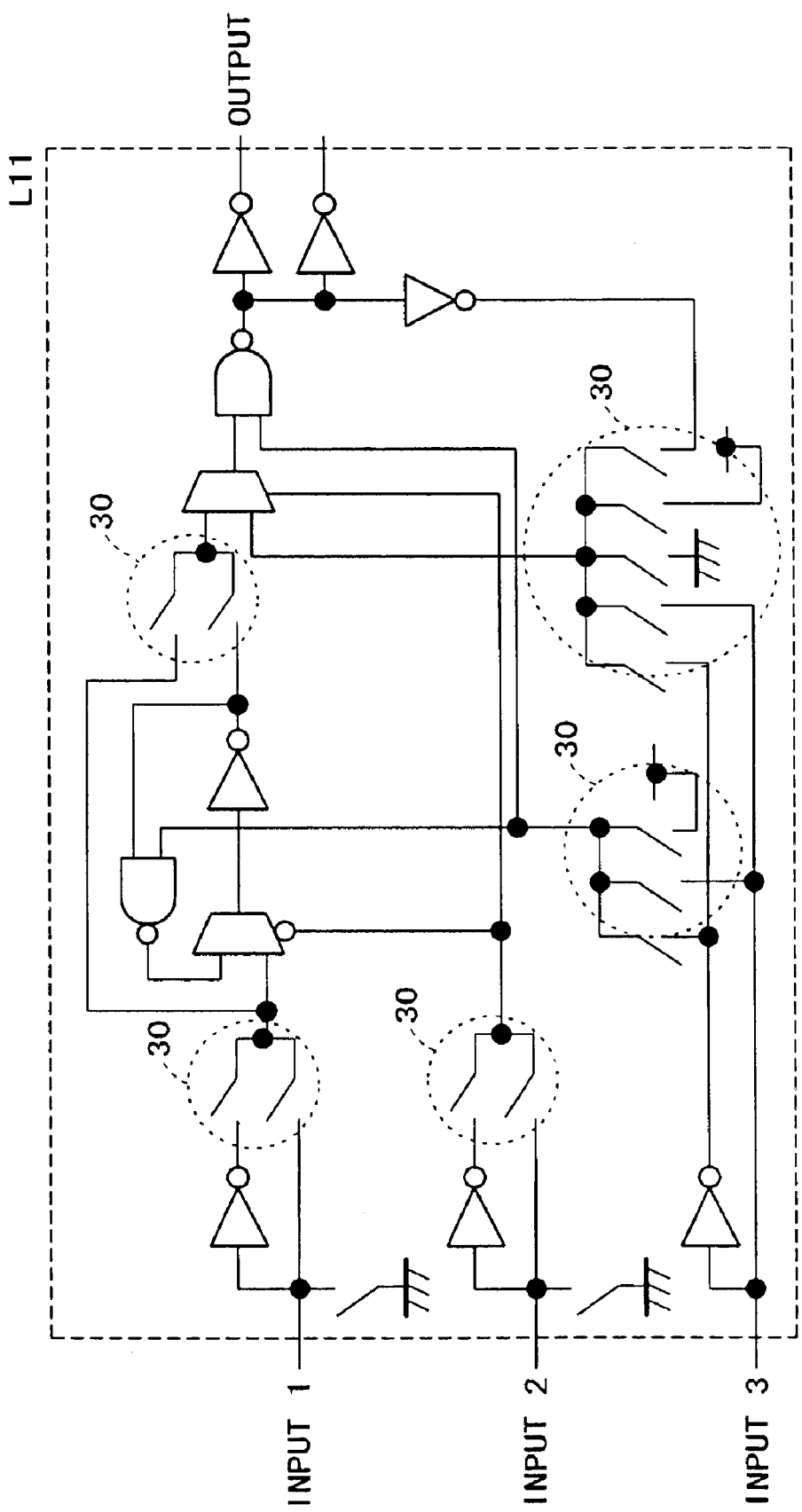
FIG. 13 is a logic circuit diagram illustrating an example of a logic cell.

FIG. 13 illustrates an example of circuitry of the above-mentioned logic cell L11. The circuitry shown in FIG. 13 has a programmable feature and includes combinational logic elements with three inputs, flip-flops, and latch circuits. In FIG. 13, each switch marked by reference number 30 is constructed with the nonvolatile memory cell NVC having the split gate MONOS structure and other transistors.

Figure 14:
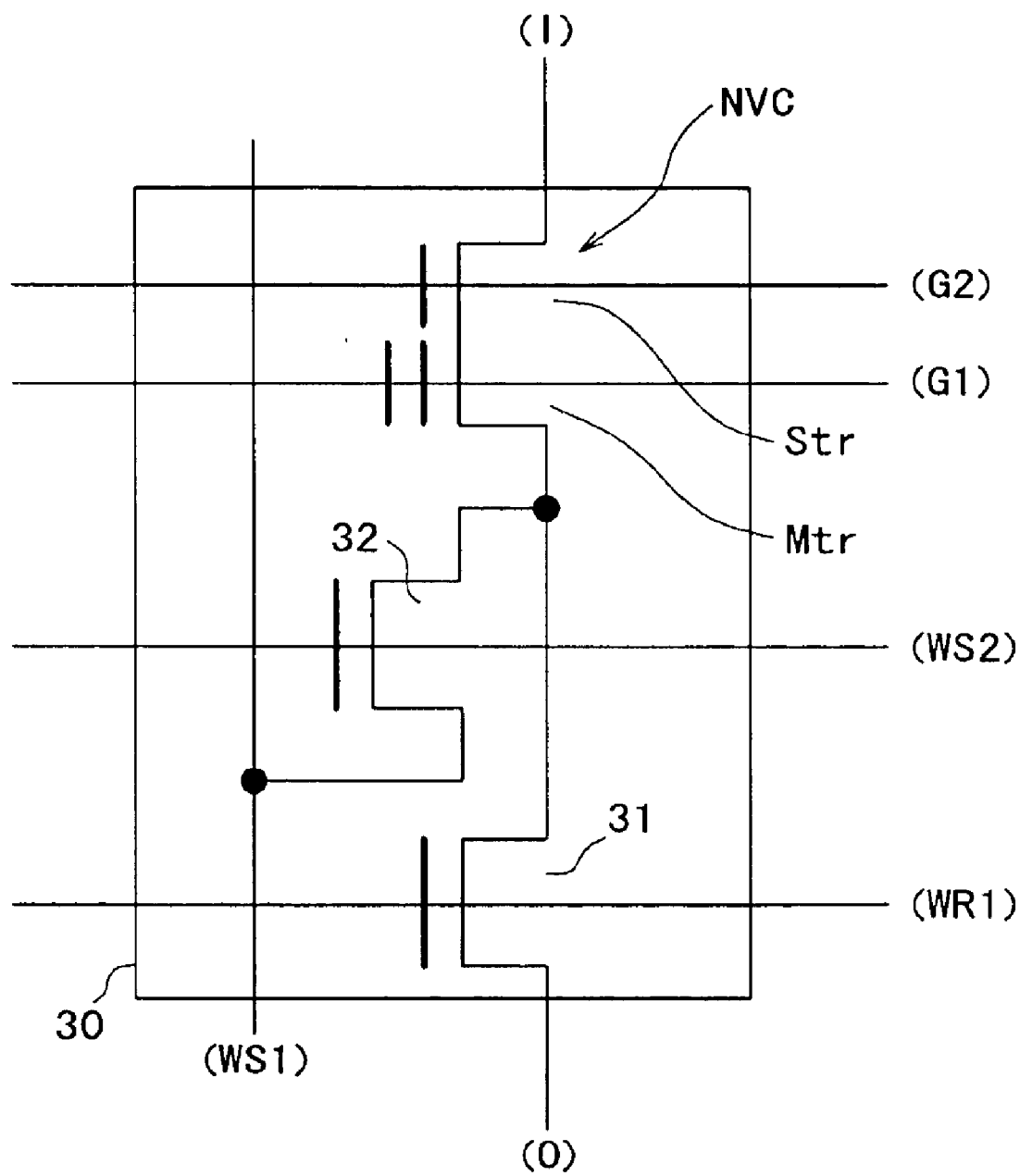
FIG. 14 is a circuit diagram illustrating an example of a switch included in the logic cell.

FIG. 14 illustrates an example of a switch 30. To the above-described nonvolatile memory cell NVC, a read select MOS transistor 31 and a write select MOS transistor 32 are connected. A gate signal line G1 is connected to the memory gate MG of the nonvolatile memory cell NVC and a gate signal line G2 is connected to the selecting gate SG of the nonvolatile memory cell NVC. WS1 and WS2 are write select lines and WR1 is a read select line.

FIG. 15 shows a table containing exemplary voltages of the lines and ports of the switch 30 of FIG. 14 as the conditions subject to which the state of the switch is determined. To erase data from the nonvolatile memory cell NVC, apply voltage, for example, 12 V to the gate signal line G1 and voltage, for example, 1.5 V, to the gate signal line G2. Thereby, the charge of the storage node is drawn toward the gate. By erasure, the threshold voltage of the memory MOS transistor Mtr becomes, for example, –1 V. To write data into the memory cell NVC, apply voltage, for example, 6 V to the write select line WS1 and voltage, for example, 8 V to the write select line WS2, thereby applying 6 V to the drain of the memory MOS transistor Mtr. At the same time, apply voltage, for example, 8V to the gate signal line G1 and voltage, for example, 1V to the gate signal line G2. Thereby, hot carriers take place in the region of proximity to the G2 line in the transistor Mtr to which the G1 line is connected and charge is injected into the storage node. Because the hot carriers take place at a high efficiency, writing is performed at a high speed. By writing, the threshold voltage of the memory MOS transistor MTrC becomes, for example, 2 V. Meanwhile, when the memory cell NVC is placed in the no writing state, either the WS1 line or the WS2 line remains at 0 V (WS2 is 0 V in the case of FIG. 15) and no voltage is applied to the drain of the memory cell NVC. At this time, the threshold voltage of the memory MOS transistor Mtr is virtually the same as that in the erasure state; for example, –1 V. During usual operation, apply voltage, for example, 1.5 V to the WR1 line with other lines remaining at 0 V. The voltage on the WR1 line makes the circuit between the terminals 1 and 0 when writing is not performed and breaks the circuit therebetween when writing is performed.

Figure 16:
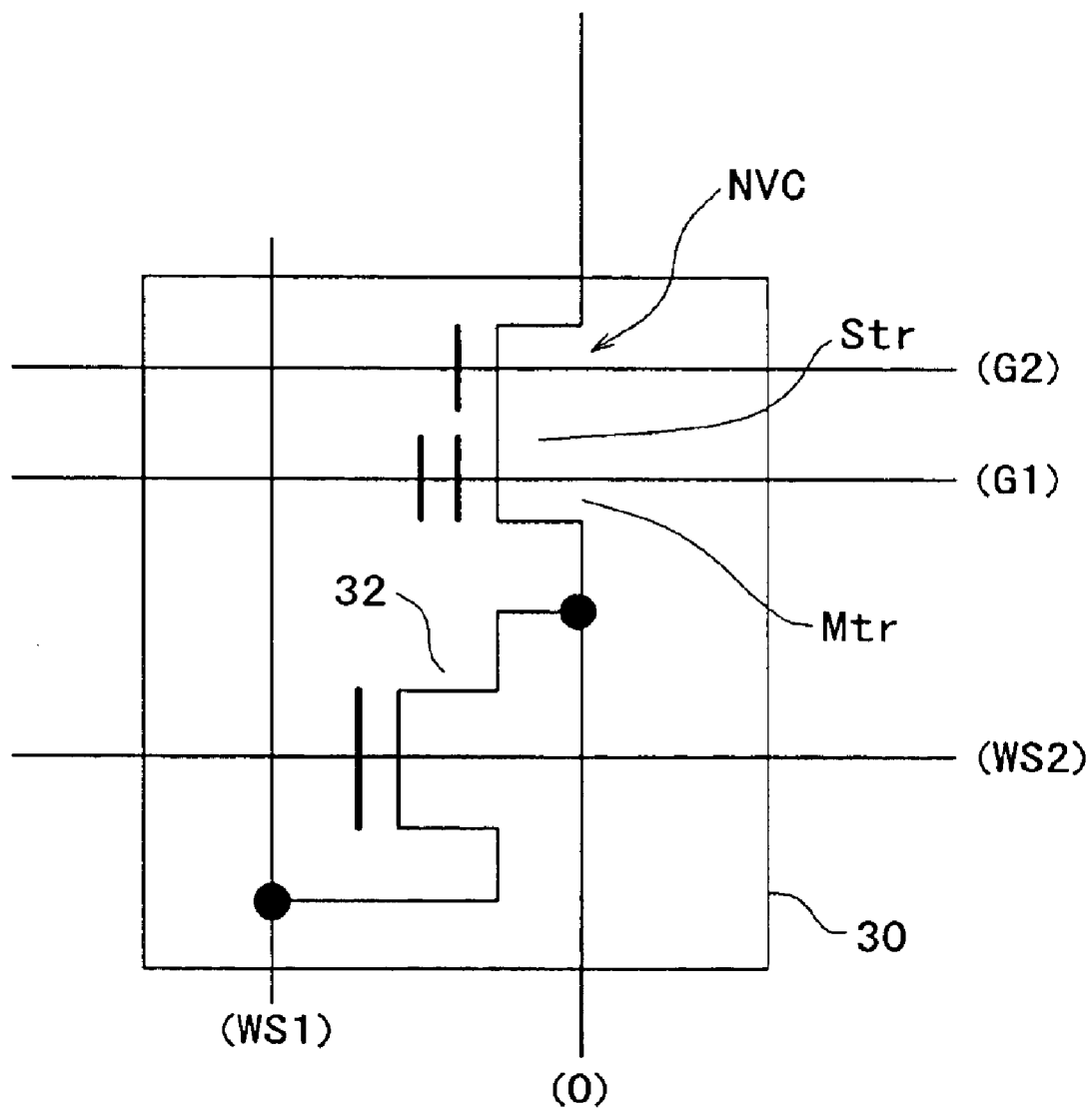
FIG. 16 is a circuit diagram illustrating another example of the switch.

FIG. 16 illustrates another example of the switch 30. In the switch embodiment of FIG. 16, the read select line WR1 and the MOS transistor 31 controlled by the WR1 line have been removed from the switch embodiment of FIG. 14. As is the case for the switch embodiment of FIG. 14, writing is selected by voltage relationship between the WS1 and WS2 lines. Because only the nonvolatile memory cell exists on the line connecting the terminals I and O, the resistance between the terminals O and I can be reduced when the nonvolatile memory cell is placed in the written state.

Figure 17:
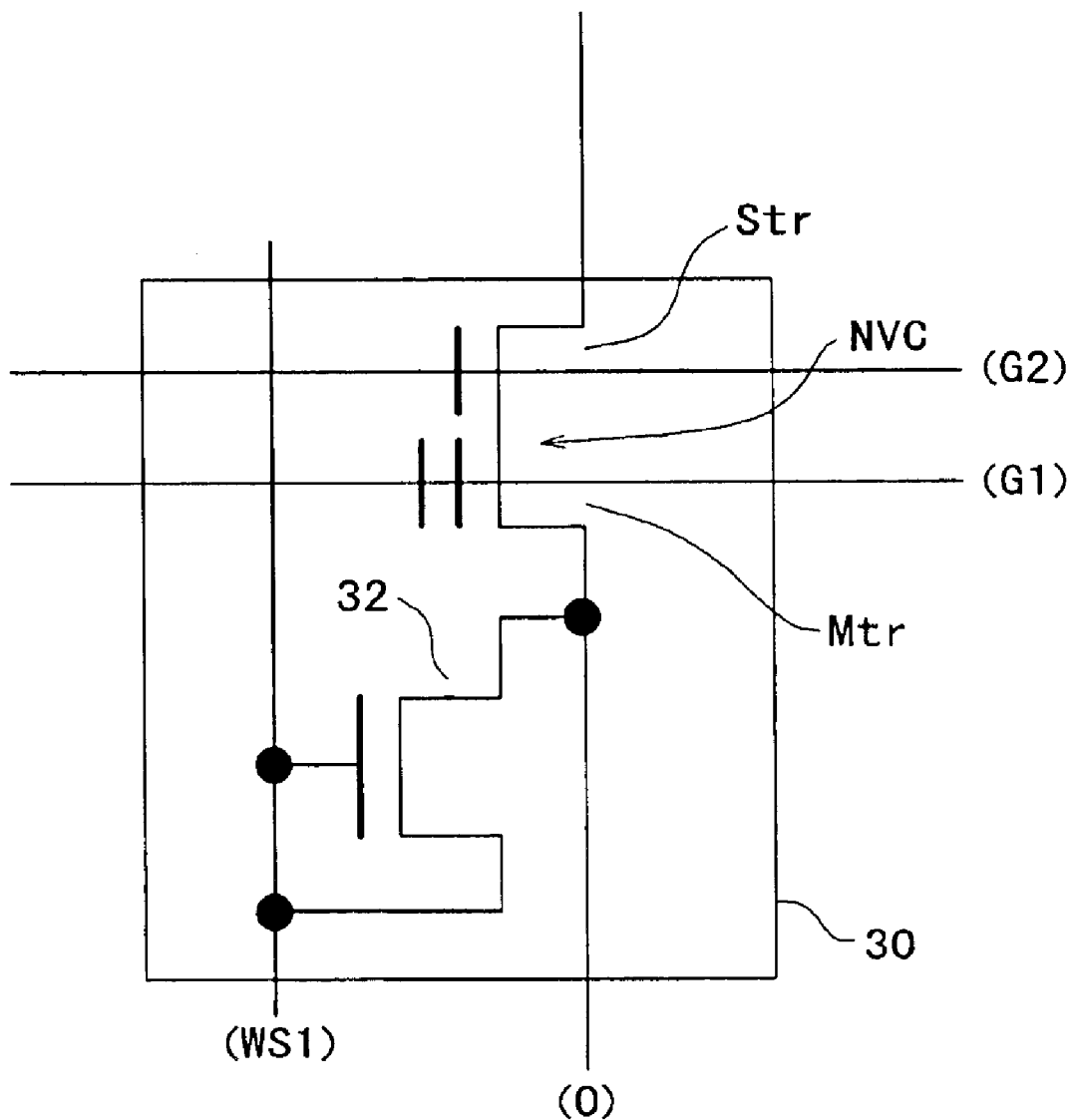
FIG. 17 is a circuit diagram illustrating yet another example of the switch.

FIG. 17 illustrates yet another example of the switch 30. The switch embodiment of FIG. 17 dispensed with the WS2, which is only difference from that of FIG. 16. When writing is selected, apply voltage, for example, 7 V to the WS1 line, then 7 V less the threshold voltage of the MOS transistor 32 to which the WS1 line is connected is applied to the drain of the nonvolatile memory cell NVC. At this state, applying 8 V to the gate G1 of the nonvolatile memory cell NVC produces hot carries in the nonvolatile memory cell NVC and charge is injected into the storage node.

Figure 18:
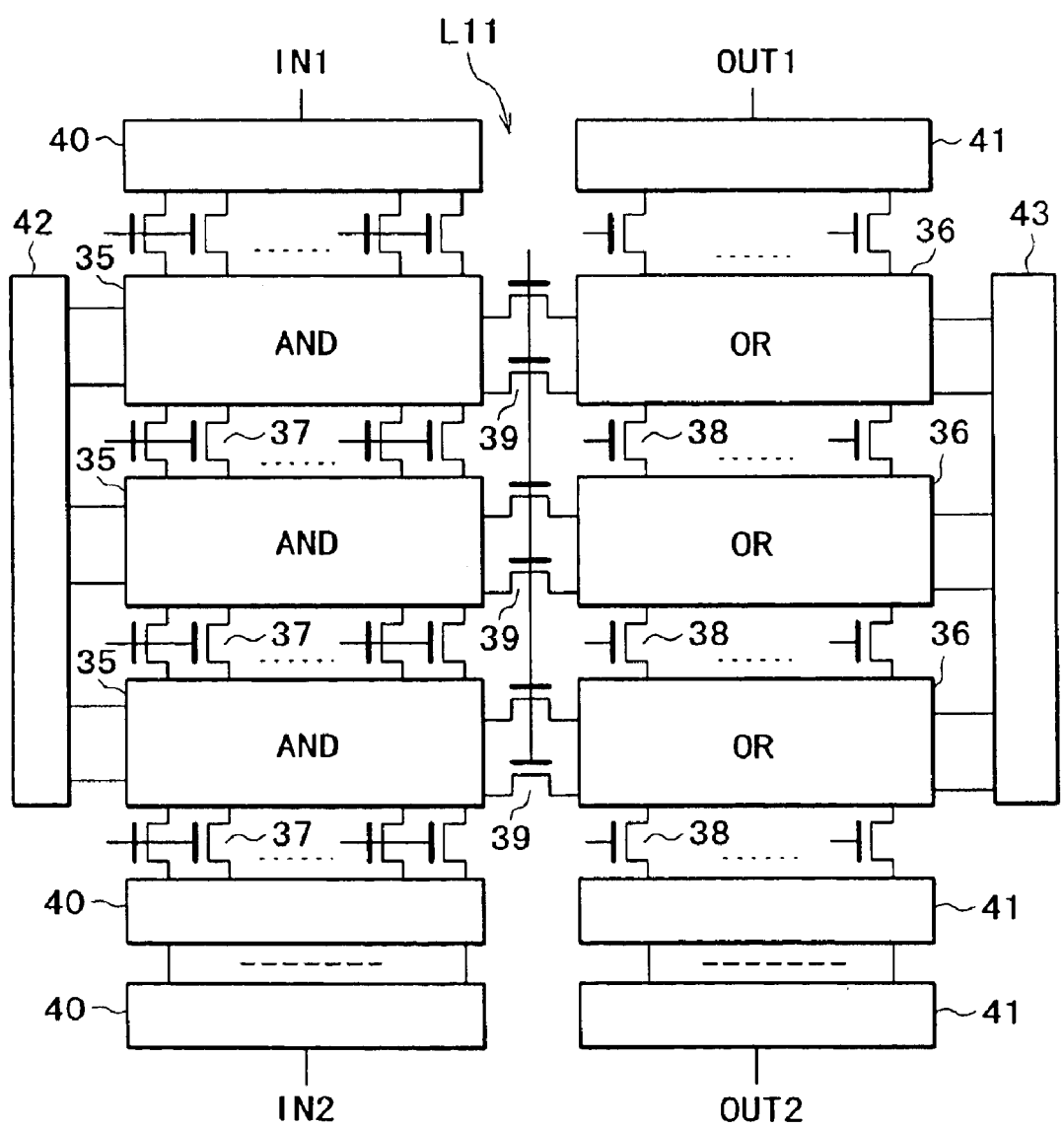
FIG. 18 is a block diagram illustrating AND/OR circuitry as another example of the logic cell.

FIG. 18 illustrates AND/OR circuitry as another example of the logic cell L11. The logic cell L11 includes a plurality of AND sections 35 and OR sections 36. The AND sections 35 can be connected each other and disconnected by switches 37. The OR sections 36 can be connected each other and disconnected by switches 38. Horizontally adjacent pairs of an AND section 35 and an OR section 36 can be connected and disconnected by switches 39, respectively. Reference number 40 denotes an input circuit to the AND sections 35; 41 denotes an output circuit from the OR sections 36; 42 denotes an input/output circuit to/from the side of the AND sections 35; 43 denotes an input/output circuit to/from the side of the OR sections 36.

Figure 19:
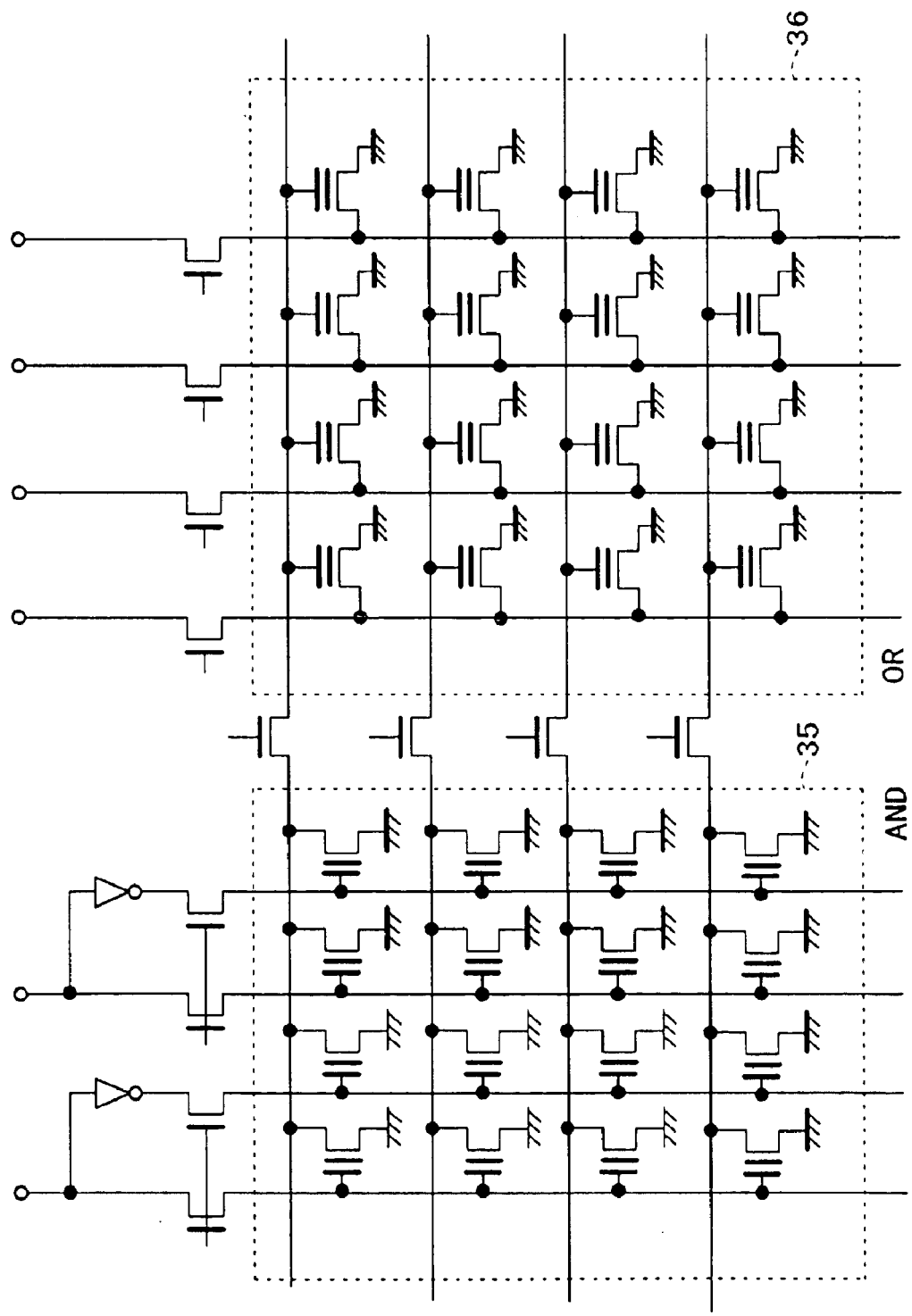
FIG. 19 is an exemplary schematic circuit diagram of an AND section and an OR section.

FIG. 19 illustrates an exemplary schematic circuit diagram of an AND section 35 and an OR section 36. In FIG.

19, a nonvolatile memory cell is designated with a symbol that commonly stands for a conventional flash memory element with a floating gate; however, it is actually constructed as the nonvolatile memory cell having the split gate MONOS structure illustrated in FIG. 4 and other drawings. Because the AND section 35 and OR section 36 can be constructed in a small area, logic elements of arbitrary combinations can be realized efficiently. Activating the AND/OR sections to perform a function that was set can be done with a low supply voltage, for example, 1.5 V that is the same voltage as for logic circuits such as the CPU 2. The AND/OR circuitry actually includes control circuits for writing and erasure to/from the nonvolatile memory cells and a power supply circuit, which, however, are not shown in FIGS. 18 and 19.

FIG. 20 illustrates an example of the above-mentioned switch cell S11. The switch cell SL11 comprises a matrix arrangement of switches 47 which are capable of selective connection and disconnection between vertical signal lines 45 and horizontal signal lines 46, switches 49 which are capable of selective connection and disconnection of the vertical lines, and switches 48 which are capable of selective connection and disconnection of the horizontal lines. Each of the above switches 47, 48, and 49 is constructed with the nonvolatile memory cell NVC having the split gate MONOS structure illustrated in FIG. 4 and other drawings. The switch cell can be constructed in a small area. After setting the switches to operate as intended, they can be activated with a low supply voltage, for example, 1.5 V that is the same voltage as for logic circuits such as the CPU 2. The switch cell circuitry actually includes control circuits for writing and erasure to/from the nonvolatile memory cells and a power supply circuit, which, however, are not shown in FIG. 20.

Figure 21:
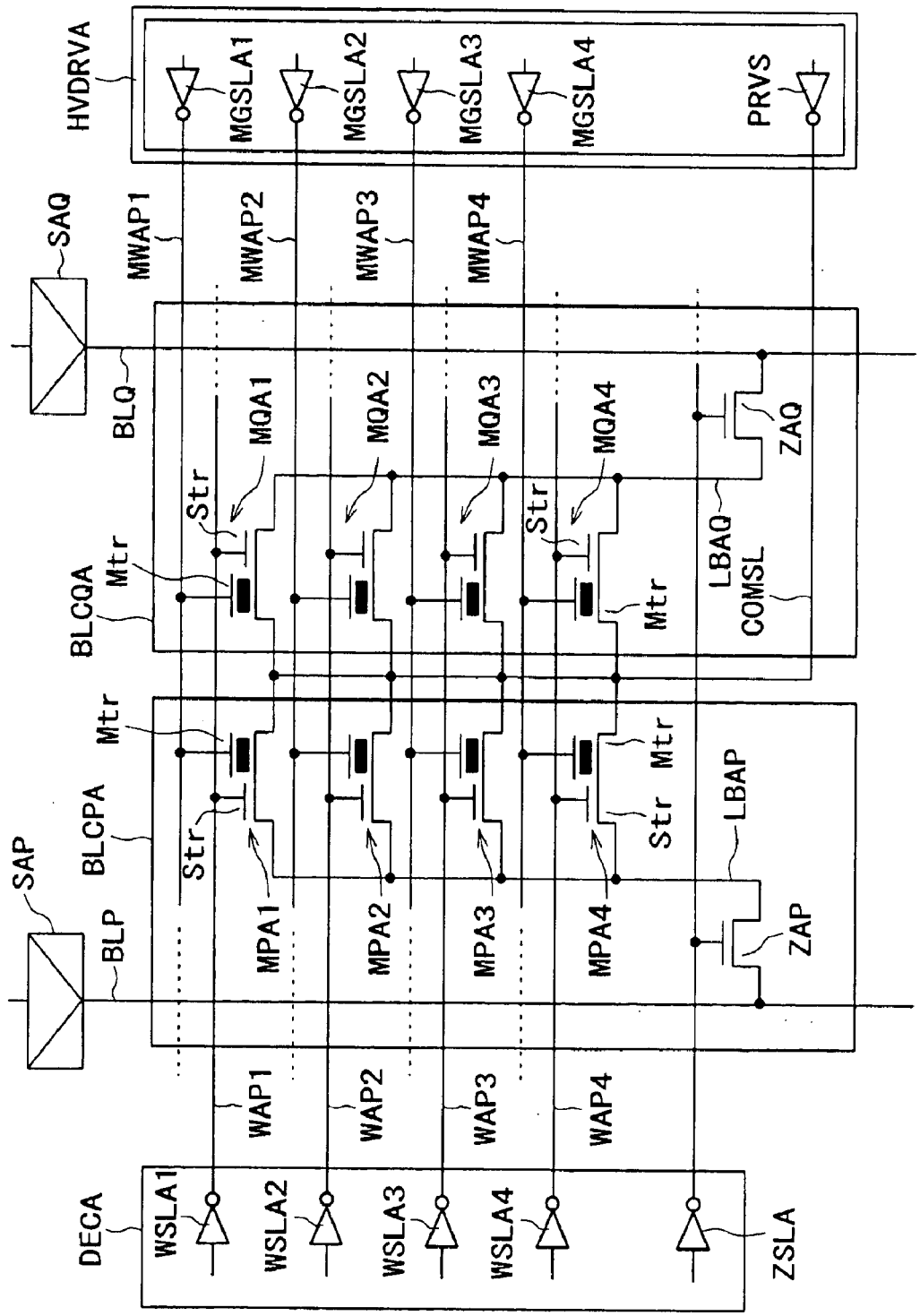
FIG. 21 is an exemplary schematic circuit diagram of the flash memory unit.

FIG. 21 illustrates an exemplary schematic circuit diagram of the flash memory unit 8. Its fundamental structure is a NOR type using hierarchically arranged bit lines. For simplification, two global bit lines BLP and BLQ are shown here as typical ones. To a sense amplifier SAP, the global bit line BLP is connected. The global bit line BLP has a node to branch to a local bit line. ZAP is a selecting MOS transistor for selecting a local bit line LBAP. To the local bit line LBAP, a plurality of memory cells MPA1 to MPA4 are connected. The memory cells MPA1 to MPA4 are constructed as the above-described nonvolatile memory cells having the split gate MONOS structure. While four memory cells are shown as typical ones in FIG. 21, the number of memory cells to be connected to the local bit line is arbitrary; for example, 64 cells are possible. The selecting MOS transistor side of each memory cell is connected to the local bit line LBAP. The selecting MOS transistor ZAP and the memory cells MPA1 to MPA4 are enclosed with a block BLCPA. The block BLCPA and another block BLCQA are symmetrical and, in the block BLCQA, memory cells MQA1 to MQA4 are connected to a local bit line LBAQ and a MOS transistor ZAQ for selecting them exists. Another global bit line BLQ is for the block BLCQA and connected to a sense amplifier SAQ.

The selecting MOS transistors ZAP and ZAQ are MOS transistors fabricated such that their gate oxide layer has the same thickness as the gate oxide layer of a MOS transistor for core logic (the MOS transistor for logic LMOS illustrated in FIG. 6). A driver ZSLA sends signals to their gate electrode. The driver ZSLA is also constructed as an equivalent to the MOS transistor for core logic (the MOS transistor for logic LMOS illustrated in FIG. 6).

The gate electrode of the selecting MOS transistor Str of each memory cell NVC is connected to a transverse word line that runs across horizontally adjacent blocks. For example, the gate electrode of the selecting MOS transistor Str of the memory cell MPA1 belonging to the block BLCP and the gate electrode of the selecting MOS transistor Str of the memory cell MQAL belonging to the block BLCQ are connected to the word line WAP1. A driver WSLA1 selects the word line WAP1 and this is also an equivalent to the MOS transistor for core logic. There are one-to-one correspondences between the word lines WAP2 to WAP4 and the drivers WSLA2 to WSLA4. Aggregation of the drivers WSLA1 to WSLA4 and the driver ZSLA is labeled a driver group DECA.

The gate of the memory MOS transistor MTr in each memory cell NVC is also connected to a transverse line. MWAP1 is a common line to which the gates of the memory MOS transistors Mtr of the memory cells MPA1 and MQA1 are connected. Because of application of a rather high voltage for writing and erasure, a driver MGSLA1 that supplies voltage on the line MWAP1 is constructed as a high-voltage-tolerant MOS transistor. There are one-to-one correspondences between the lines MWAP2 to MWAP4 and the drivers MGSLA2 to MGSLA4. For writing, 5 V must be supplied on a line COMSL that is shared by both blocks BLCPA and BLCQA. A driver PRVS that is constructed as a high-voltage-tolerant MOS transistor supplies this voltage. Aggregation of the drivers MGSLA1 to MGSLA4 and driver PRVS which are constructed as high-voltage-tolerant MOS transistors is labeled a driver group HVDRVA. As shown in FIG. 21, the global bit lines BLP and BLQ are connected to other blocks which are not shown and driver groups for the other blocks exist. For reading, the individual drivers constituting the driver group DECA select a word line, according to the address and are able to drive the selected line at a high speed because they have the performance equivalent to core logic. Each nonvolatile memory cell MPA1 to MQA4 is constructed as the nonvolatile memory cell having the split gate MONOS structure illustrated in FIG. 4 and other drawings and its selecting MOS transistor also has the Gm performance equivalent to the MOS transistor for core logic (the MOS transistor for logic). Thus, quicker reading of data can be performed.

In the following, programming of the EPGA unit 3 and the flash memory unit 8 using the nonvolatile memory cells NVC having the split gate MONOS structure illustrated in FIG. 4 and other drawings will be described.

Programming the FPGA unit 3 to effect intended functions and writing data and programs into the flash memory unit 8 may be performed, using the I/O 4, as illustrated in FIG. 1. In such cases, it is an efficient way that the I/O is connected to an external writing device such as an EPROM writer and programming and writing is performed from the external writing device. In this case, the semiconductor integrated circuitry should be set in a predetermined operation mode so that the operator of the external writing device can handle the FPGA unit 3 or the flash memory unit 8 as a single device.

Figure 22:
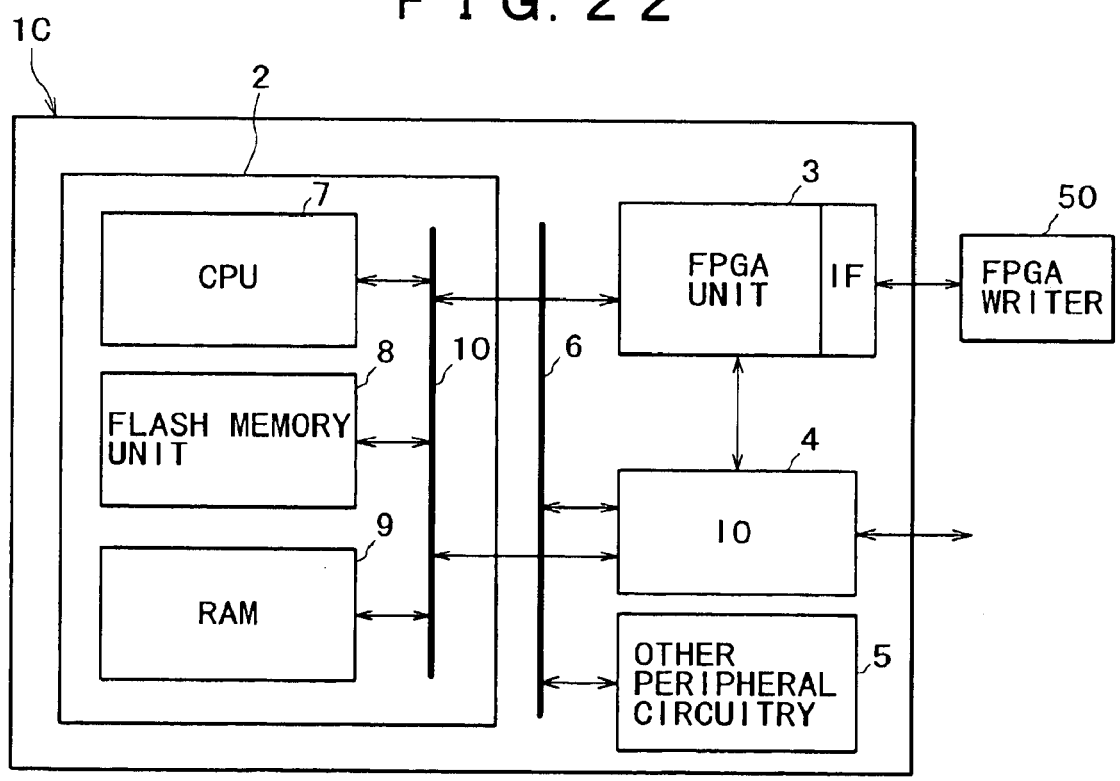
FIG. 22 is a block diagram of another embodiment of the semiconductor integrated circuitry of the invention which enables the use of a writing device dedicated to the FPGA unit such as an FPGA writer.

FIG. 22 illustrates another embodiment of the semiconductor integrated circuitry of the invention which uses a writing device dedicated to the FPGA unit 3 such as an FPGA writer. In this embodiment of the semiconductor integrated circuitry 1C, the FPGA unit 3 has an interface circuit 51 for the FPGA writer.

Figure 23:
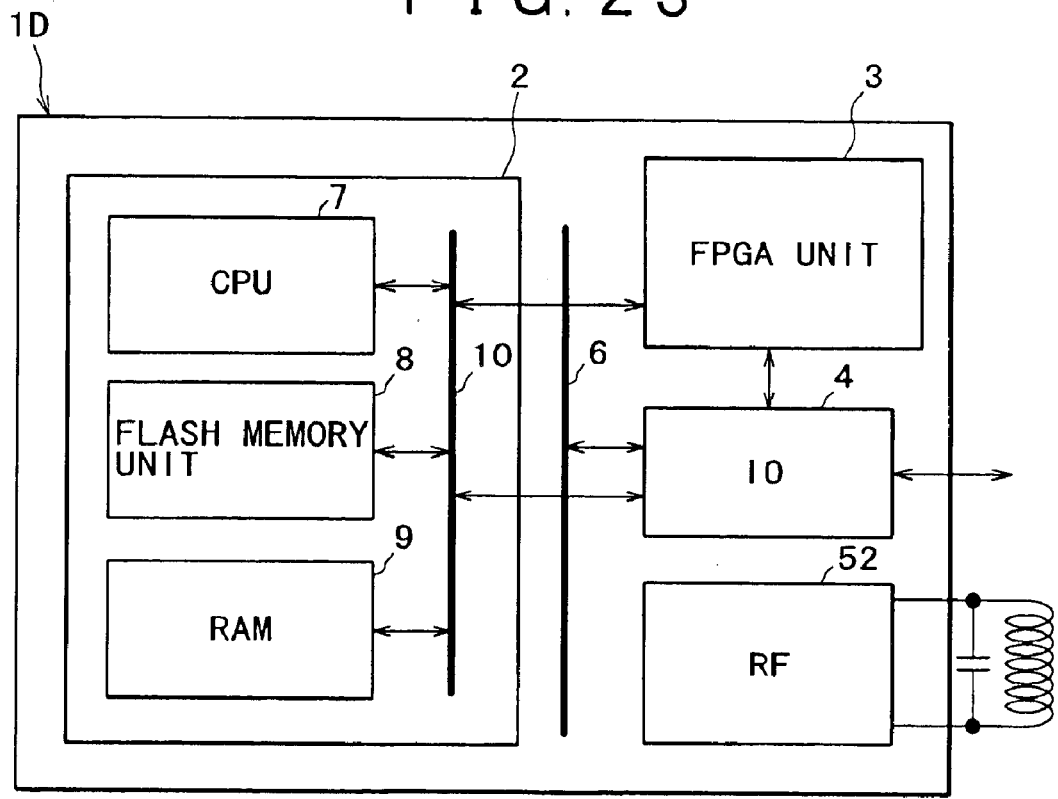
FIG. 23 is a block diagram of yet another embodiment of the semiconductor integrated circuitry of the invention which enables the use of a radio frequency interface circuit (RFIF) for programming the FPGA unit and the flash memory unit.

FIG. 23 illustrates yet another embodiment of the semiconductor integrated circuitry of the invention which uses a radio frequency interface circuit (RFIF) 52 for programming the FPGA unit 3 and the flash memory unit 8. The RFIF 52 enables programming of the FPGA unit 3 or the flash memory unit 8 via a radio network or another network connected to the radio network, using radio frequencies, for example, a 2.4 GHz band. This is convenient for adding new functions and debugging programs after the shipment of the semiconductor integrated circuitry 1D or after it is mounted on the circuit board.

Figure 24:
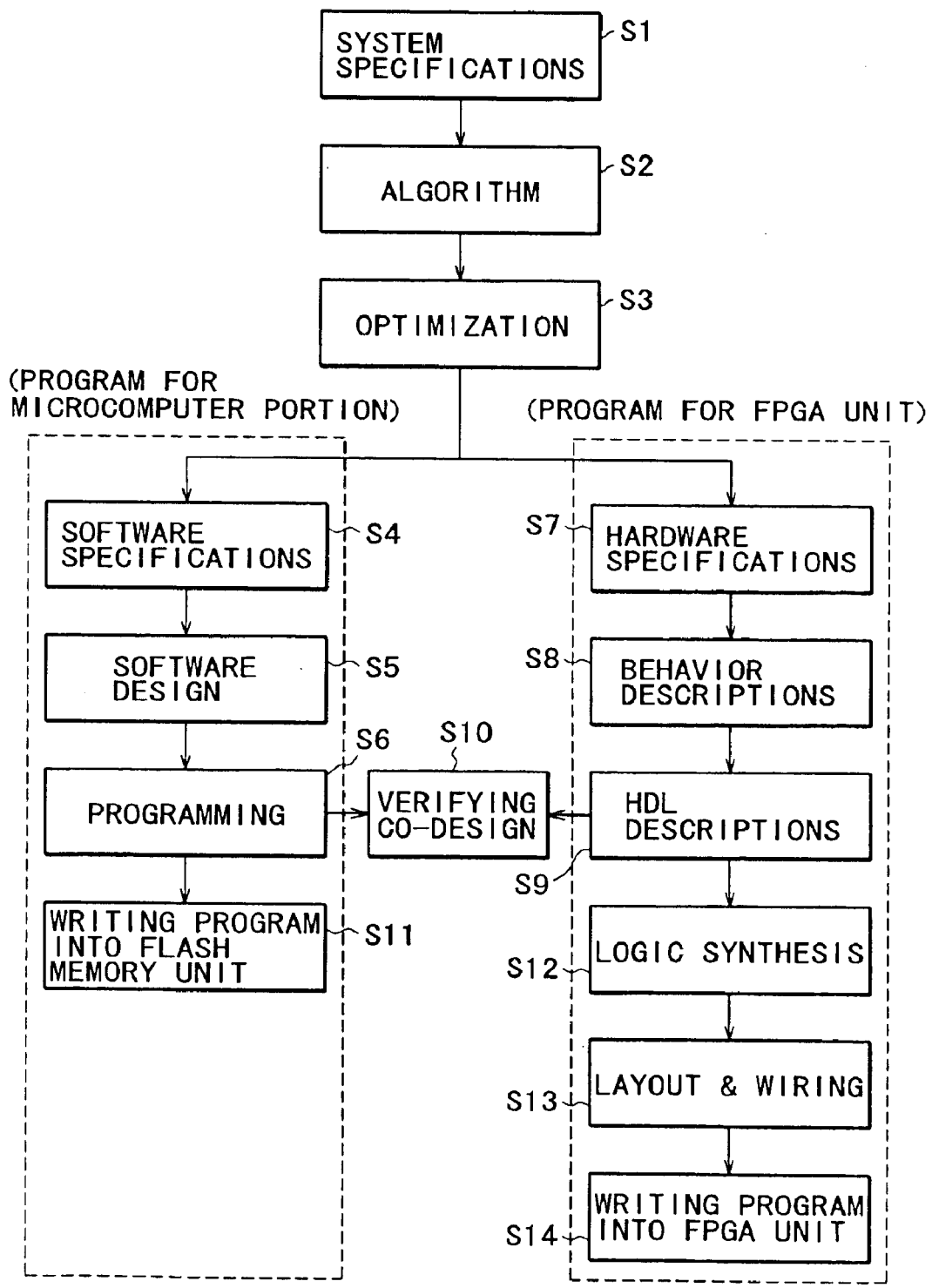
FIG. 24 is a flowchart illustrating a flow of programming of the FPGA unit and the flash memory unit.

FIG. 24 illustrates a flow of programming of the FPGA unit 3 and the flash memory unit 8.

The semiconductor integrated circuitry 1, 1A to 1D, illustrated hereinbefore, has two programmable sections: the FPGA unit 3 and the flash memory unit 8. Programming of the flash memory unit 8 can be regarded as software design for the microcomputer portion 2. Programming of the FPGA unit 3 can be regarded as hardware design. The design that is programmed and stored into the FPGA unit 3 may include reconfiguring normal circuit portions, that is, hardware portions that cannot be changed by a program. The software design for the microcomputer portion may include program code to cause the hardware portions reconfigured by the set contents of the FPGA unit 3 to operate as an interface circuit or a so-called accelerator. The semiconductor integrated circuitry of the invention is provided with hardware functions effected by the FPGA unit 3 and functions of storing a control program for CPU operation for using the hardware functions or data for tuning the hardware into the flash memory unit 8 of the microcomputer portion 2. This means that a system to be built on a single chip can be co-designed, based on a so-called hardware/software co-design method in which a system is divided into a software processing portion and a hardware processing portion and the design process is performed so that hardware and software can cooperate well. This is a new concept that is realized by the present invention.

FIG. 24 illustrates an example of the above hardware/software co-design flow. In the co-design procedure, first, determine system specifications required for the system (S1). Determine algorithm for realizing the specifications (S2). In the next optimization step (S3), determine what is processed by the microcomputer portion 2 and what is effected by the FPGA unit 3 for all particulars of the specifications. After this determination, separate design processes for hardware and software are performed, but redesign may be required if necessary by the result of the step of verifying co-design which will be described later; in that event, return to the optimization step for reconsideration. After the optimization step (S3), for the microcomputer portion 2, determine software specifications (S4), perform software design (S5) according to the specifications, and perform actual programming (S6). On the other hand, for the FPGA unit 8, determine hardware specifications (S7), generate behavior descriptions, and complete HDL descriptions (S8, S9). Both the programming for the microcomputer portion 2 and the completed HDL descriptions for the FPGA unit 8 are verified for consistency from the perspective of one system. This is the step of verifying co-design (S10). According to the result of this verification, return to the optimization step (S3) may occur as noted above or particular design and descriptions may be modified. Through such modification, once it has been verified that everything is OK, write the program into the flash memory unit 8 of the microcomputer portion 2 (S11). For the FPGA unit 8, perform logic synthesis, based on the HDL descriptions (S12), determine layout and wiring (S13), and set connections of lines among a multiplicity of nonvolatile memory cells of the FPGA unit 8 as programmed, thus reflecting the logic settings in the FPGA unit 8 (S14).

By carrying out the above procedure, a sequence of the steps of design and function setting is completed. Because both the software portion and the hardware portion can be designed by programming in this way, it is easy to realize semiconductor integrated circuitry having functions meeting intended system specifications. Tools suitable for the steps of the procedure of FIG. 24 should be prepared. These tools are regarded as design tools for realizing the new concept of building a system on a chip by software and hardware co-design.

Figure 25:
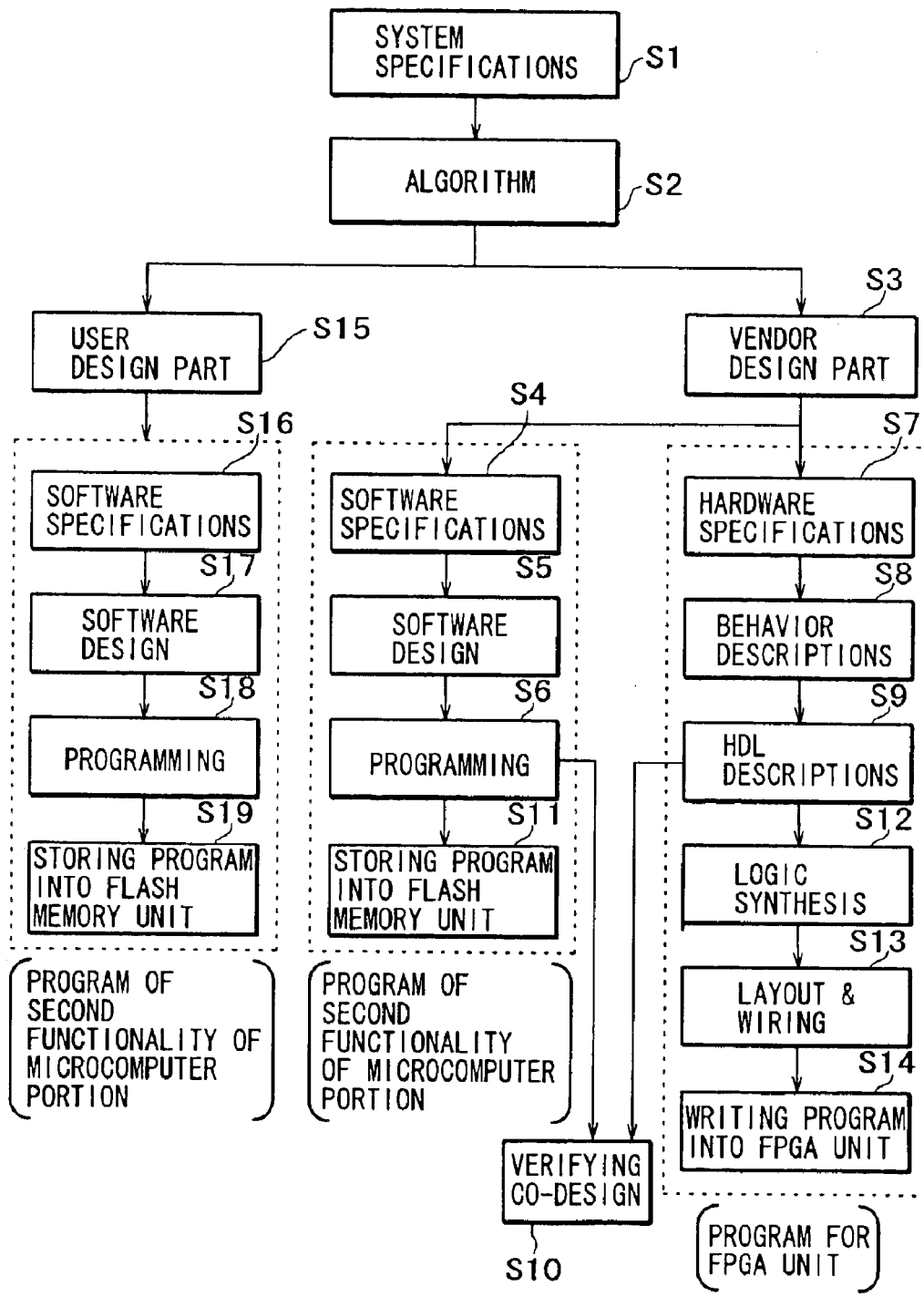
FIG. 25 is a flowchart illustrating another example of the co-design flow of the above programming.

FIG. 25 illustrates another example of the above-described co-design flow. The design flow shown in FIG. 25 is intended to realize semiconductor integrated circuitry in such a manner that certain functionality is provided by, for example, a vendor (the supplier of the semiconductor integrated circuitry product and other functionality is provided by an individual user (the user of the semiconductor integrated circuitry product). Here, the vendor programs the FPGA unit and one part of functionality of the microcomputer portion 2 (first functionality of the microcomputer portion) and the user programs only the other part of functionality of the microcomputer portion 2 (second functionality of the microcomputer portion). The steps to be performed by the vendor are the same as illustrated in FIG. 24. The steps to be performed by the user are as follows: determine what is designed by the user (S15) and then perform steps (S16 to S19) which are substantially the same as the above-mentioned steps S3 to S6.

In this example, for example, the vendor provides the main part of functionality to be realized by the semiconductor integrated circuitry and options by programming the FPGA unit 8 and part of the microcomputer portion 2. The user provides functionality that depends on practical application by programming part of the microcomputer portion 2. According to this example, it is possible for the vendor to develop a single product of semiconductor integrated circuitry to be supplied to a plurality of users that require different specifications in detail for specific application, based on common general specifications. On the other hand, it is possible for the user to use the design part provided by the vendor to meet the specifications, for example, those conforming to any kind of standards and exclusively carry out design of functionality to be altered for practical application.

While a single vendor and a single user are involved in the procedure illustrated in FIG. 25, a plurality of vendors and users may be involved. In addition to cases where a plurality of users are involved as described above, it is conceivable that vendor A and vendor B are responsible for designing different portions of a system and the system includes a portion to be altered by an individual user. In some cases, vendor A and vendor B complete their design and programming at different time, or their designs are different hierarchies, or vendor B is the user of vendor A.

Figure 26:
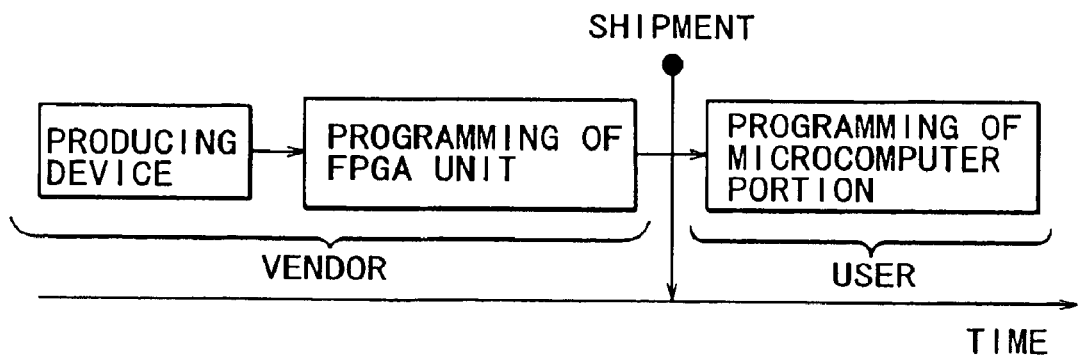
FIG. 26 represents an example of a relationship between vendor programming and user programming in time sequence.

FIG. 26 represents an example of a relationship between vendor programming and user programming in time sequence. In this case, the vendor programs the FPGA unit B and determines the main performance of the semiconductor integrated circuitry. For example, the semiconductor integrated circuitry is used as an encryption processing chip or a moving picture compression/decompression processing chip. The user programs and uses the microcomputer portion 2 as the processor suitable for the functionality of the chip.

Figure 27:
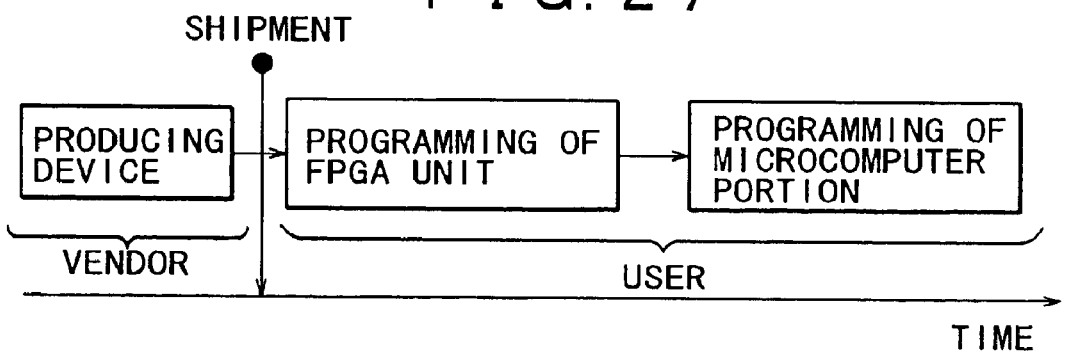
FIG. 27 represents another example of a relationship between vendor programming and user programming in time sequence.

FIG. 27 represents another example of a relationship between vendor programming and user programming in time sequence. In this case, the vendor provides the semiconductor integrated circuitry as the hardware product without programming the FPGA unit 3 and the flash memory unit 8. The user programs both the FPGA unit 3 and the flash memory unit 3 of the microcomputer portion. The user is given an increased degree of freedom of design.

Figure 28:
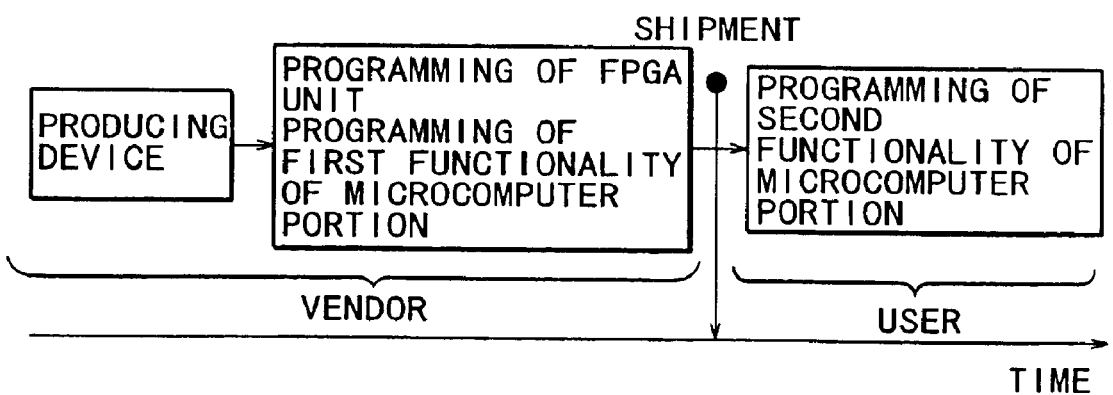
FIG. 28 represents a further example of a relationship between vendor programming and user programming in time sequence.

FIG. 28 represents a further example of a relationship between vendor programming and user programming in time sequence. In this case, the vendor programs the FPGA unit 3 and programs the flash memory unit 8 to realize the first functionality of the microcomputer portion, and ships the semiconductor integrated circuitry. The user programs the flash memory unit 8 to realize the second functionality of the microcomputer portion. This mode of programming is suitable for users that prefer simple customizing.

Figure 29:
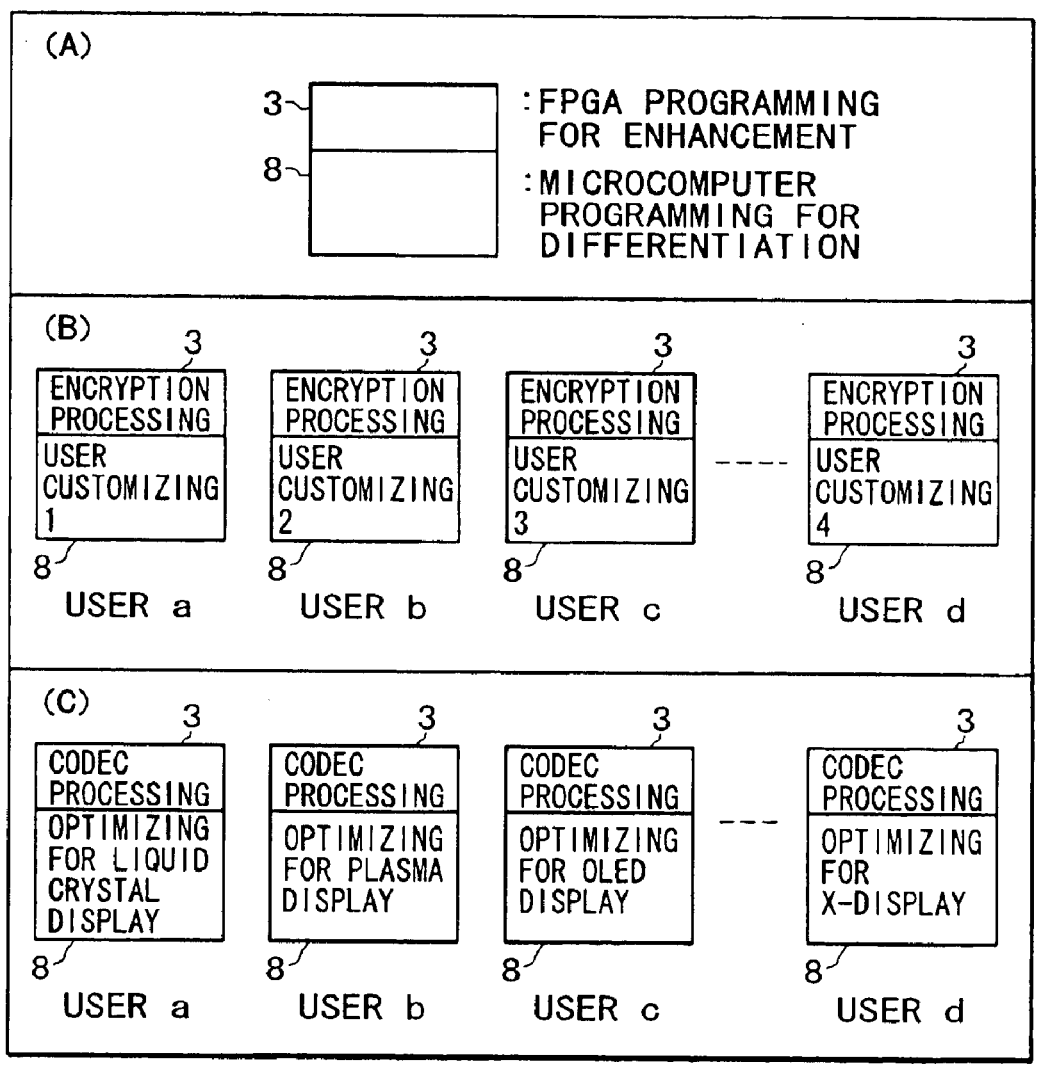
FIG. 29 represents an example of functionality for specific application which is programmed to be performed by the semiconductor integrated circuitry.

FIG. 29 represents an example of functionality for specific application which is programmed to be performed by the semiconductor integrated circuitry. For the semiconductor integrated circuitry 1, 1A to 1D having the two programmable sections of the FPGA unit 3 and the flash memory unit 8, its performance for specific application can be enhanced, according to the FPGA programming and the microcomputer programming as illustrated in section (A) of FIG. 29. What is the specific application is what is implemented by microcomputer and FPGA programming and usage of the semiconductor integrated circuitry 1, 1A–1D can be defined by programming. For example, when augmenting or adding an encryption processing function according to given algorithm to the semiconductor integrated circuitry, as illustrated in section (B) of FIG. 29, the FPGA unit 3 is programmed to provide hardware functionality for the encryption processing from the hardware perspective. At the same time, a user-customized option program per user is added to the flash memory unit 8 of the microcomputer portion 2. In this way, a chip developed for users who desire the encryption processing can be supplied to a plurality of users having different needs. When augmenting or adding a moving picture coding/decoding (CODEC) function to the semiconductor integrated circuitry, as illustrated in section (C) of FIG. 29, the FPGA unit 3 is programmed to provide hardware functionality for the CODEC processing from the hardware perspective. At the same time, program code for optimizing a display device per user is written and stored into the flash memory unit 8 of the microcomputer portion 2. In this way, a chip developed for users who desire the moving picture CODEC processing can be supplied to a plurality of users having different needs of a display device.

As illustrated in the above sections B and C, a single product of semiconductor integrated circuitry can be enhanced to provide different functionality such as encryption processing and CODEC processing and customized for needs per user by programming of the FPGA and flash memory units. This flexibility can make the semiconductor integrated circuitry versatile and fit for an industrial strategy of small volume production of a wide variety of products.

Figure 30:
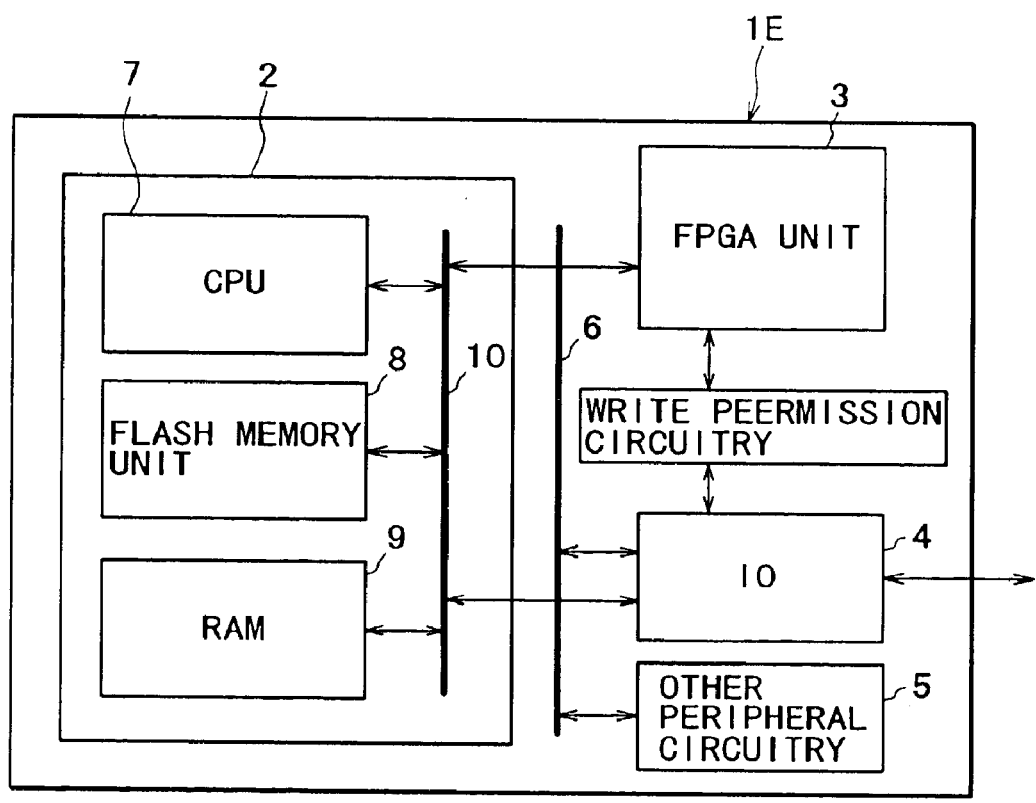
FIG. 30 is a block diagram illustrating a further embodiment of the semiconductor integrated circuitry of the invention, the embodiment offered through consideration of possible cases where vendor programming and user programming are performed.

FIG. 30 illustrates a further embodiment of the semiconductor integrated circuitry of the invention, the embodiment offered through consideration of possible cases where vendor programming and user programming are performed. In the semiconductor integrated circuitry 1E shown in FIG. 30, a write permission circuit 53 is added to the FPGA unit 3, which is difference from the corresponding circuitry shown in FIG. 1. When vendor programming and user programming are performed, the vendor may impose restrictions on writing to the FPGA unit 3 limit the writing to a particular user or limit change to a certain range. The write permission circuit 53 is provided for this restriction purpose. In some embodiments, the write permission circuit is arranged to permit writing to the FPGA unit 3 when a particular password has been input via the I/O 4 or discriminate between two passwords arranged for accessing different areas or ranges and permit writing accordingly. In the alternative, it may be arranged to allow the user to access only the write-enabled portion of the FPGA unit without using the password. As the password or key, the user may be prompted to input a predetermined command. In possible arrangement of security, access to the vendor area is permitted only when a specific signal is supplied to a particular terminal and the particular terminal is stiffly protected so that the user cannot tamper with it after the chip is enclosed in a package.

Figure 31:
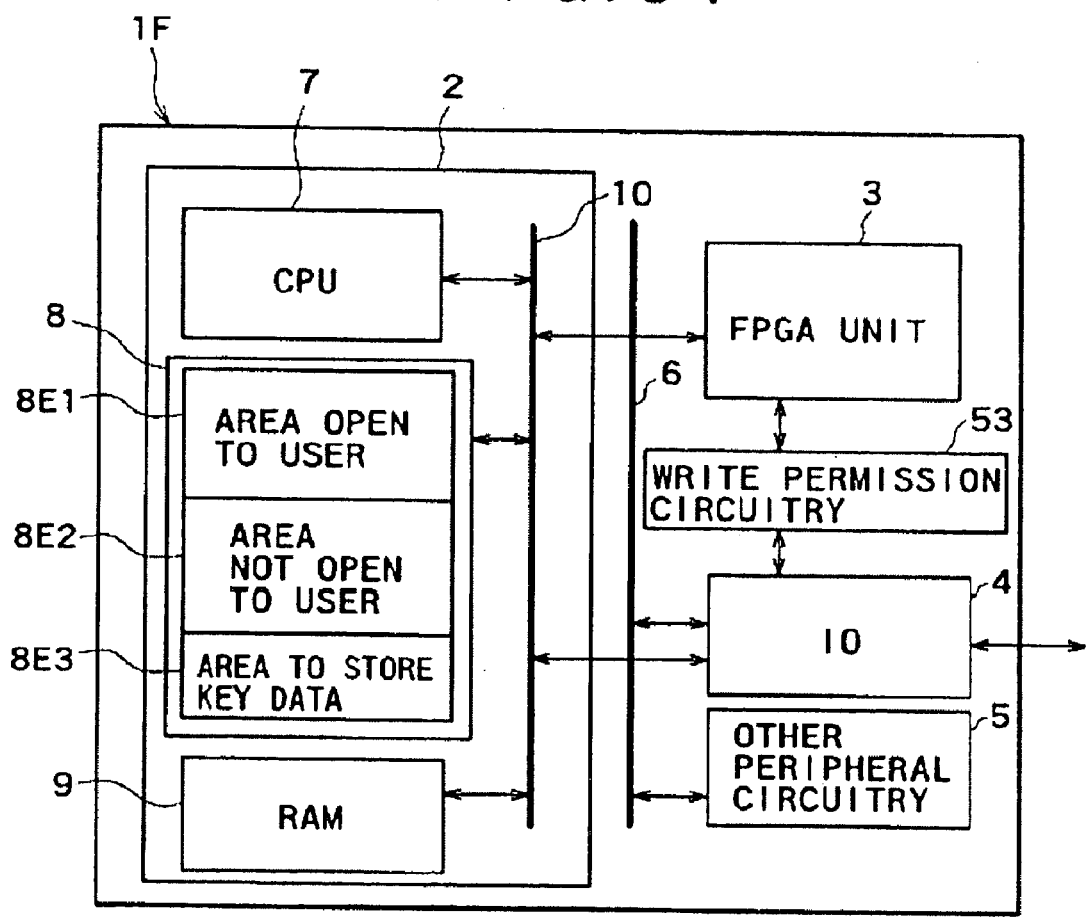
FIG. 31 is a block diagram illustrating a still further embodiment of the semiconductor integrated circuitry of the invention, the embodiment offered through consideration of possible cases where vendor programming and user programming are performed.

FIG. 31 illustrates a still further embodiment of the semiconductor integrated circuitry of the invention, the embodiment offered through consideration of possible cases where vendor programming and user programming are performed. In the semiconductor integrated circuitry 1F shown in FIG. 31, the flash memory unit 8 is arranged such that only a partial storage area is open to the user, which is difference from the circuitry of FIG. 30. The storage space of the flash memory unit 8 primarily comprises area open to user 8E1 and area not open to user 8E2. In the illustrated embodiment, the flash memory unit 8 is arranged such that access to its area not to open to user is permitted if a password code added to a command entered when access to it is attempted matches predetermined key data. The key data is stored in area 8E3 of the flash memory unit 8.

Figure 32:
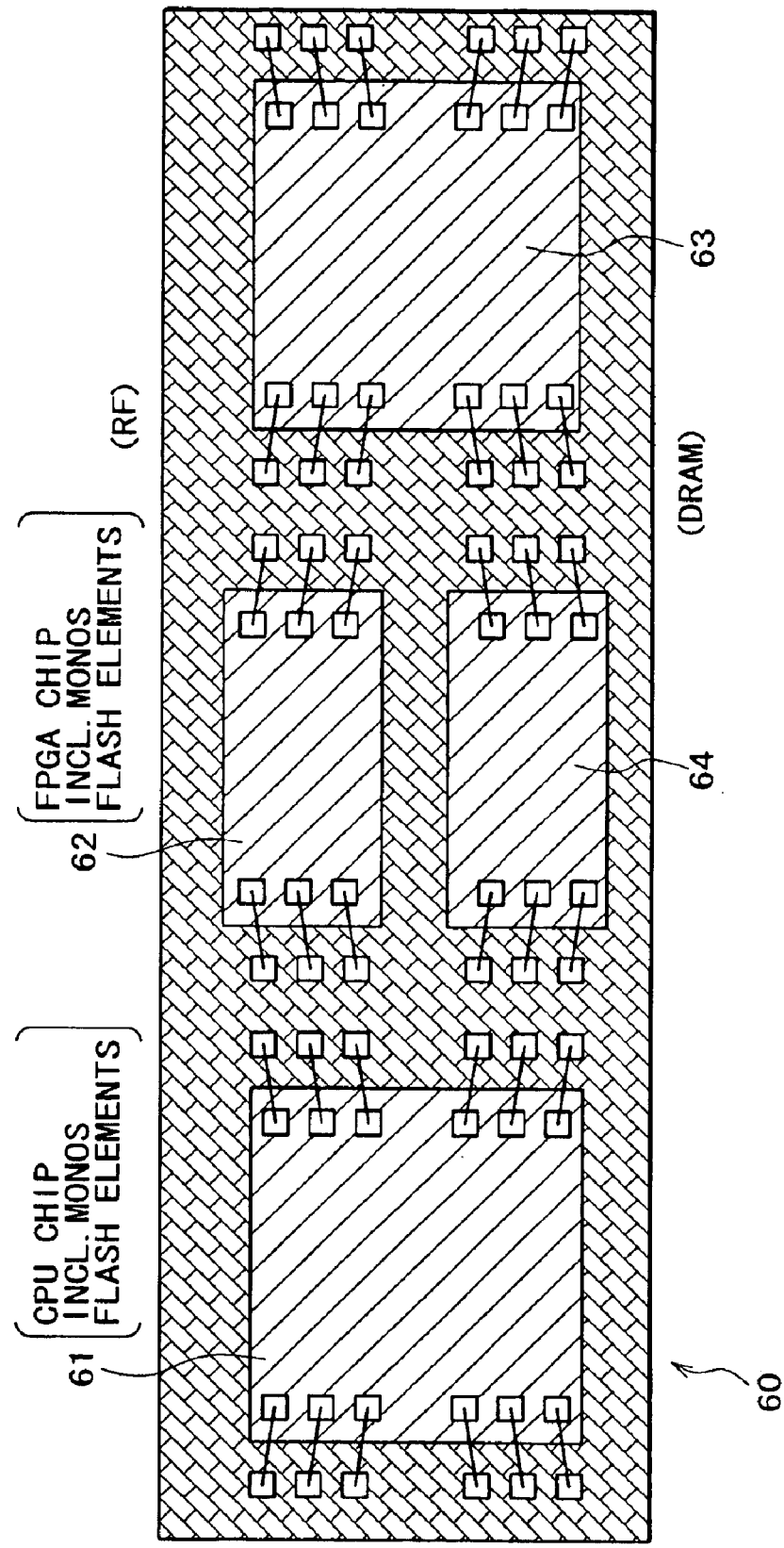
FIG. 32 illustrates an example of multi-chip module (MCM) embodiment of a semiconductor device according to the present invention in its plan view.
Figure 33:
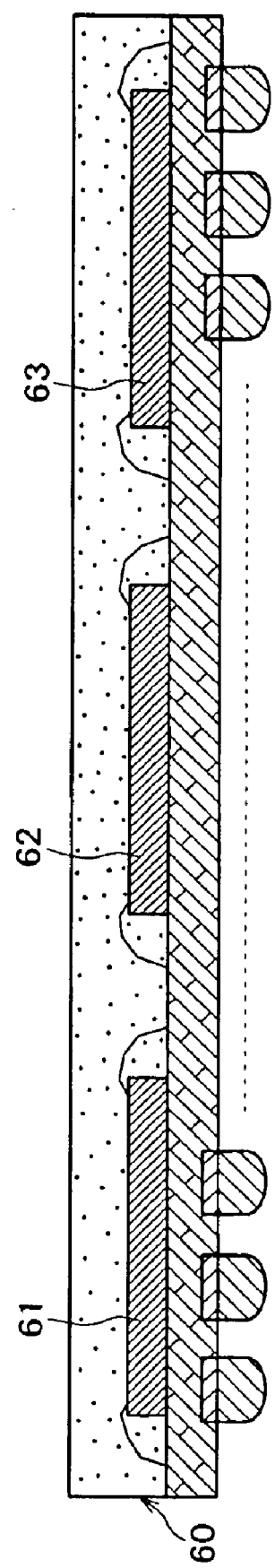
FIG. 33 illustrates an example of multi-chip module (MCM) embodiment of a semiconductor device according to the present invention in its front view.

FIG. 32 and FIG. 33 illustrate an example of multi-chip module (MCM) embodiment of a semiconductor device according to the present invention. FIG. 32 is a plan view of the MCM embodiment and FIG. 33 is its front view. The MCM 60 is composed of a microcomputer chip including MONOS elements 61, an FPGA chip including MONOS elements 62, an RF chip 63, and a DRAM 64 which are mounted on a high-density packaging substrate. The microcomputer chip including MONOS elements 61 has functionality equivalent to the above-mentioned micro computer portion 2 and includes a flash memory unit configured with nonvolatile memory cells NVC having the split gate MONOS structure illustrated in FIG. 4 and other drawings. The FPGA chip including MONOS elements 62 has functionality equivalent to the above-mentioned FPGA unit 3 and includes nonvolatile memory cells NVC having the split gate MONOS structure illustrated in FIG. 4 and other drawings as storage cells to retain logic function definition data.

In the MCM 60, specific function entities such as the RF chip 63 and DRAM 64 are incorporated on the high density packaging substrate mounted on the glass substrate. The MCM can realize high-performance functionality desired by the user in a shorter period than when its constituent parts are constructed on individual single chips.

Figure 34:
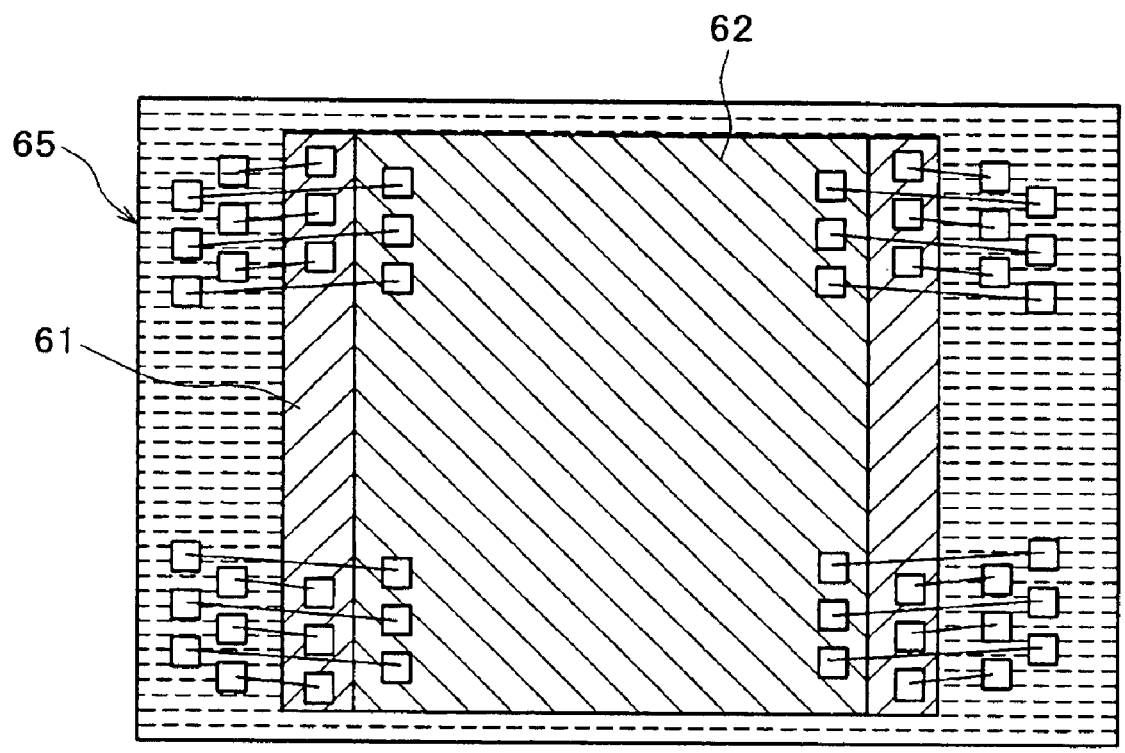
FIG. 34 illustrates an example of multi-chip package (MCP) embodiment of a semiconductor device according to the present invention in its plan view.
Figure 35:
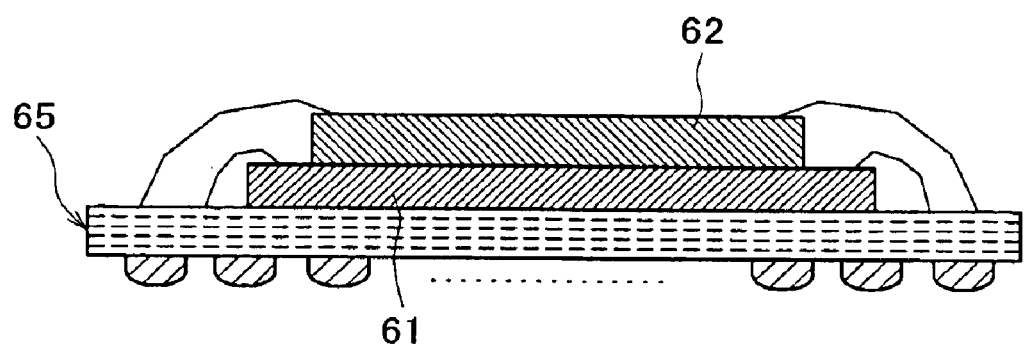
FIG. 35 illustrates an example of multi-chip package (MCP) embodiment of a semiconductor device according to the present invention in its front view.

FIG. 34 and FIG. 35 illustrate an example of multi-chip package (MCP) embodiment of a semiconductor device according to the present invention. FIG. 34 is a plan view of the MCP embodiment and FIG. 35 is its front view. The MCP semiconductor device 65 has the above-mentioned microcomputer chip including MONOS elements 61 and FPGA chip including MONOS elements 62 mounted on it. The MCP enables building a system operating on a lower power for which the trial manufacturing period is shorter.

Figure 36:
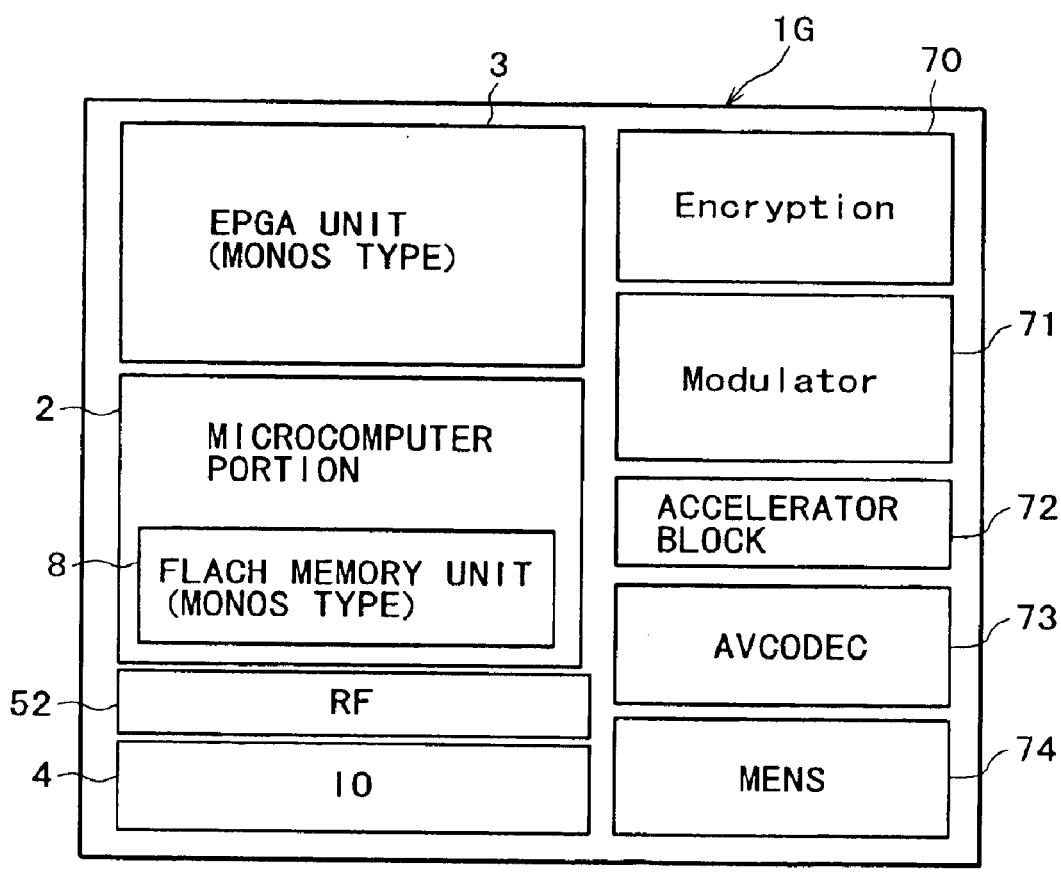

FIG. 36 illustrates an example of application of the present invention to a semiconductor integrated circuitry called a system LSI of a system-on-chip (SOC) type or the like. The semiconductor integrated circuitry 1G is composed of a microcomputer portion including MONOS elements 2, an FPGA unit including MONOS elements 3, an encryption processing accelerator block 70, a modem function block 71, an accelerator block 72 which is controlled by a Java (a registered trademark) program, an audio and moving picture CODEC processing accelerator 73, and a MEMS block 74 which is used for sensors or the like, and an interface block 4 and these components are mounted on a chip. A system is realized on a single semiconductor integrated circuitry and system functionality can be set programmably in a manner that software processing by the microcomputer portion 2 and hardware processing by the FPGA unit 3 are linked with each other. Such system has a potentiality for easily meeting higher speed requirements for future multimedia processing.

Figure 37:
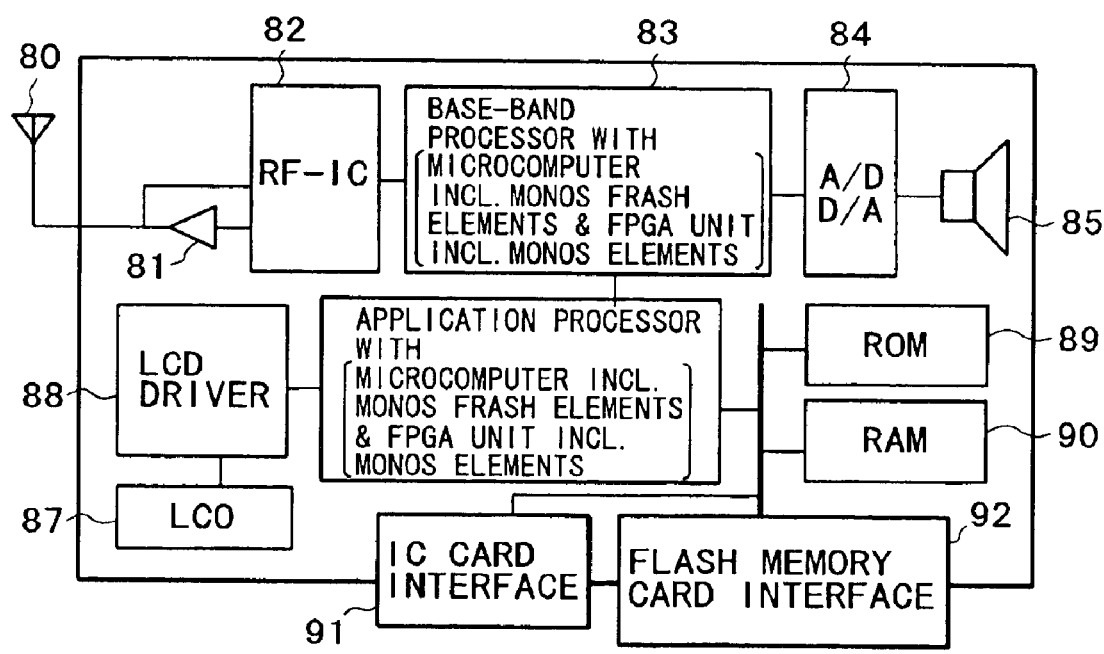
FIG. 37 is a block diagram illustrating an example of a data processing system to which the semiconductor device of the present invention is applied.

FIG. 37 illustrates an example of a data processing system to which the semiconductor device of the present invention is applied. The system illustrated in FIG. 37 is a portable communications system such as a mobile telephone. It is composed of an antenna 80, a power amplifier 81, a radio frequency interface (RF-IC) 82, a baseband processor 83, an A-D and D-A assembly 84, a microphone speaker 85, an application processor 86, a liquid crystal display (LCD) 87, an LCD driver 88, a ROM 89, a RAM 90, an IC card interface 91, and a flash memory card interface 92. The baseband processor 83 and the application processor 86 are constructed as the above-mentioned semiconductor integrated circuitry 1, 1A to 1G or the MCM 60 or the MCP semiconductor device 65 which has the above-mentioned microprocessor portion including MONOS elements and FPGA unit including MONOS elements mounted thereon. The functionality of the baseband processor 83 and the application processor 86 can be set programmably in a manner that software processing by the microcomputer portion including MONOS elements and hardware processing by the FPGA unit 3 including MONOS elements are linked with each other. Thus, the illustrated system can be quickly adaptive to change in market trends, standards, and services.

Then, a process flow of fabricating the above-described fractional structure of FIG. 6 that comprises the nonvolatile memory cell NVC, n-type MOS transistor for core logic (MOS transistor for logic), and high-voltage-tolerant MOS transistor will be described, based on FIGS. 38 through 45.

Figure 38:
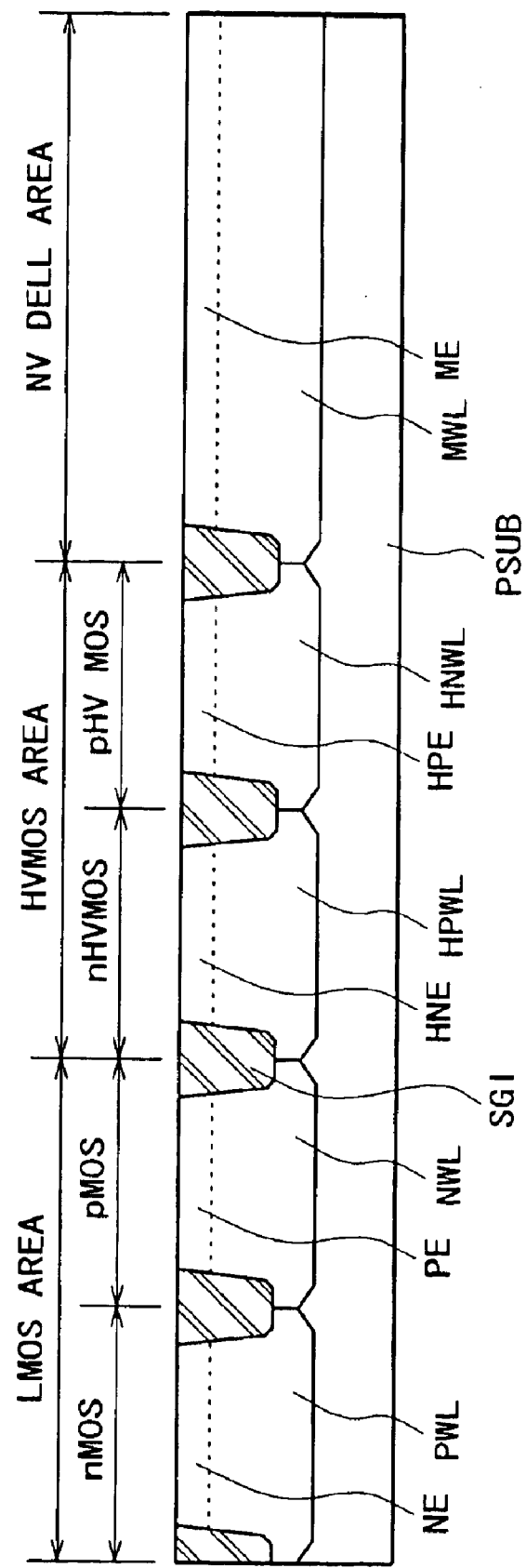
FIG. 38 is a first cross section of the fractional structure that comprises the nonvolatile memory cell NVC, n-type MOS transistor for core logic, and high-voltage-tolerant MOS transistor in the process of fabricating that structure.

Refer to FIG. 38. On the p-type silicon substrate PSUB, make the well structure composed of p-type well PWL for the n-type MOS transistor (n-MOS) for core logic, n-type well NWL for the p-type MOS transistor (p-MOS) for core logic, p-type well HPWL for the n-type MOS transistor (n-HVMOS) for controlling a rather high voltage for writing and erasure, n-type well HNWL for the p-type MOS transistor (p-HVMOS) for controlling the same, and p-type well MWL under the memory cell area. To separate these wells, insert oxide layer separation regions SGIs between the elements. Then, inject impurities for controlling the threshold voltages of the MOS transistors into the regions corresponding to the channel sections of the transistors. The threshold voltages of the transistors are as follows: NE for n-MOS; PE for p-MOS; HNE for n-HVMOS; HPE for p-HVMOS; and ME for the memory MOS transistor.

Figure 39:
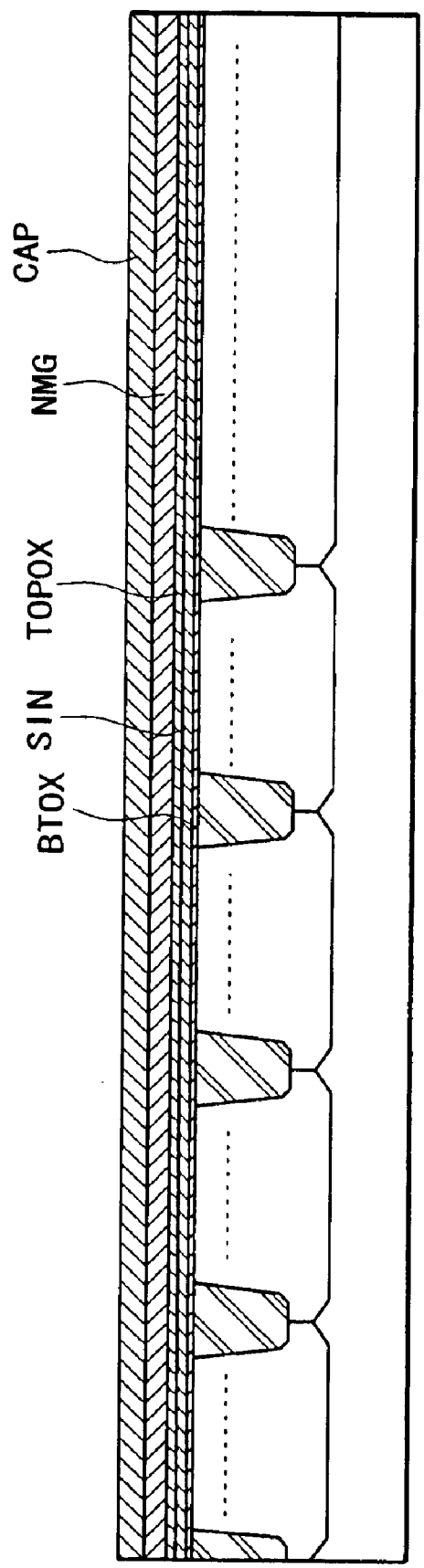
FIG. 39 is a second cross section of the fractional structure that comprises the nonvolatile memory cell NVC, n-type MOS transistor for core logic, and high-voltage-tolerant MOS transistor in the process of fabricating that structure.

Refer to FIG. 39. After cleaning the surface of the substrate, make the bottom oxide layer BOTOX (5 nm) of the memory MOS transistor by thermal oxidation. On the bottom oxide layer, deposit silicon nitride by a chemical vapor deposition method to make the silicon nitride layer SIN (15 nm). On the SIN surface, make the top oxide layer TOPOX (2 nm) by thermal oxidation. Then, deposit n-type polysilicon to make NMG (100 nm) as the memory gate electrode layer and deposit silicon oxide to make the silicon oxide layer CAP (100 nm) for protecting the MG.

Figure 40:
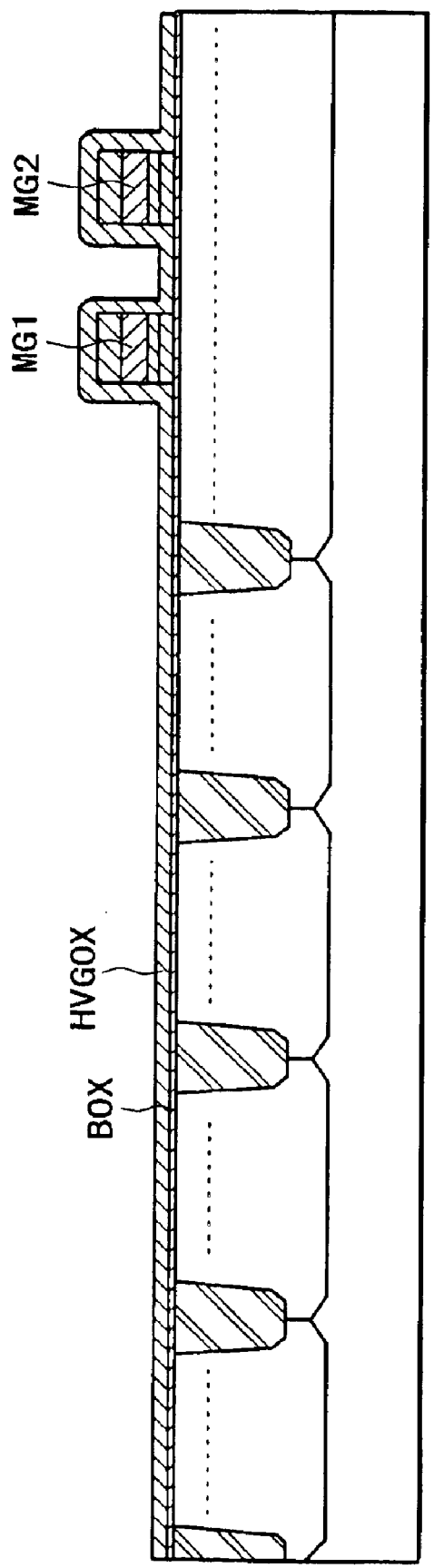
FIG. 40 is a third cross section of the fractional structure that comprises the nonvolatile memory cell NVC, n-type MOS transistor for core logic, and high-voltage-tolerant MOS transistor in the process of fabricating that structure.

Refer to FIG. 40. Using photolithography and dry etching techniques, shape the gate electrodes MG1 and MG2 of the memory MOS transistor as shown. The gate electrodes are shaped in a long line extending back in the drawing and two typical ones are shown, though as many gate electrodes as the word lines exist. When forming the gate electrodes, terminate dry etching as soon as the BOTOX surface is exposed and remove the remaining BOTOX with fluoride. Take this manner to prevent unacceptable damage to the substrate surface. Chemical treatment with fluoride makes the substrate surface exposed. Then, make the thermally oxidized layer BOX (5 nm) and deposit silicon oxide to make the silicon oxide layer HVGOX (15 nm). These two oxide layers will eventually serve as the gate oxide layer of the MOS transistor for controlling a rather high voltage. Because the simply deposited layers are insufficient in reliability, they are laminated.

Figure 41:
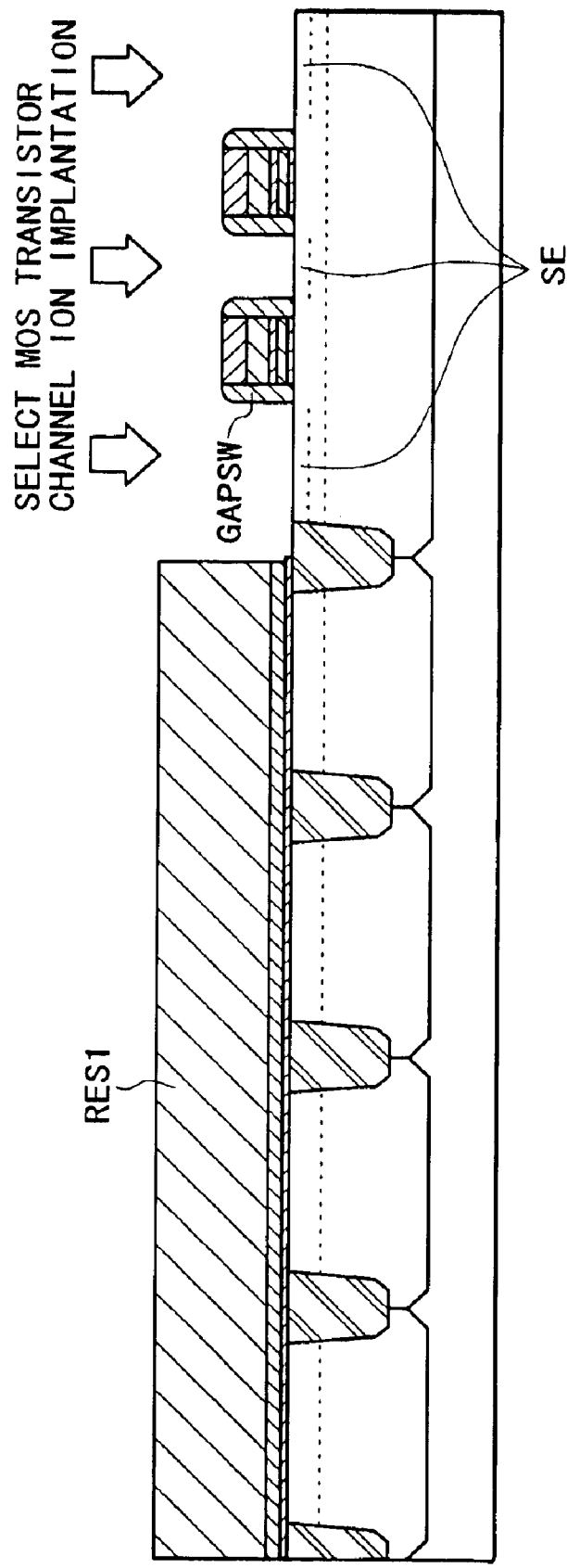
FIG. 41 is a fourth cross section of the fractional structure that comprises the nonvolatile memory cell NVC, n-type MOS transistor for core logic, and high-voltage-tolerant MOS transistor in the process of fabricating that structure.

Refer to FIG. 41. Using the photolithography technique, form a photo resist and shape it to RES1. By etching the silicon oxide layer by an anisotropic dry etching technique, remove the oxide layer existing in the channel region of the selecting MOS transistor and expose the substrate surface. By this etching process, lateral spacers GAPSW for the HVGOX formations are also formed in the area of the selecting MOS transistor of the memory MOS transistor. With the RES1 remaining as is, form an impurities layer SE in the channel region of the selecting MOS transistor. The SE and ME must be formed, according to the relation between SE and ME as shown in FIG. 7.

Figure 42:
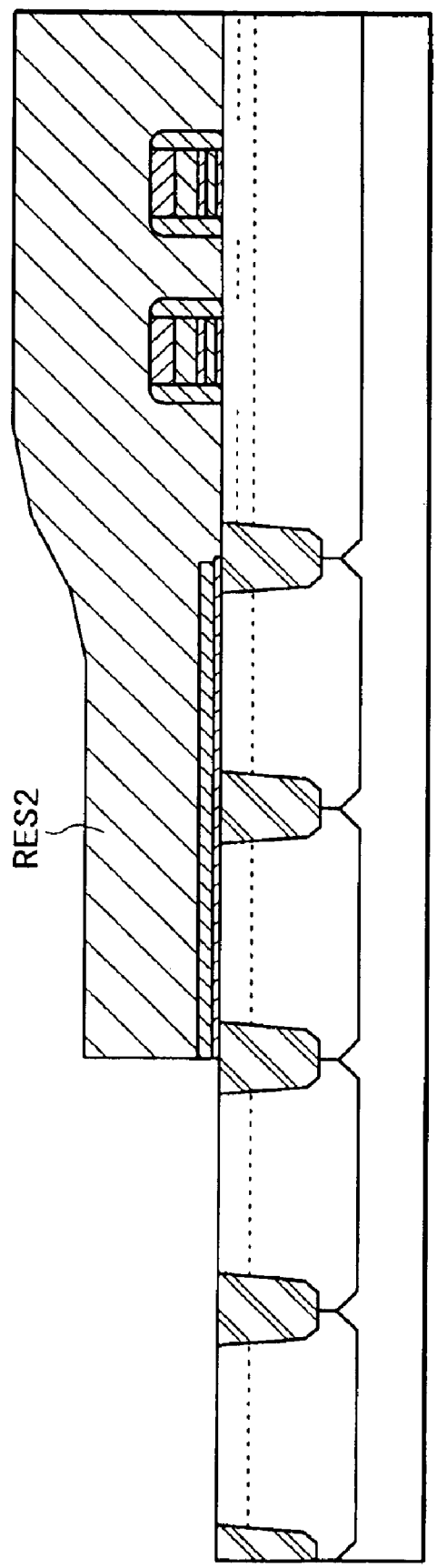
FIG. 42 is a fifth cross section of the fractional structure that comprises the nonvolatile memory cell NVC, n-type MOS transistor for core logic, and high-voltage-tolerant MOS transistor in the process of fabricating that structure.

Refer to FIG. 42. Using the photolithography technique, form a photo resist RES2 and allow only the area (LMOS area) where the MOS transistor for core logic is constructed to remain open. Completely remove the oxide layer of lamination composed of BOX and HVGOX by fluoride treatment from the LMOS area.

Figure 43:
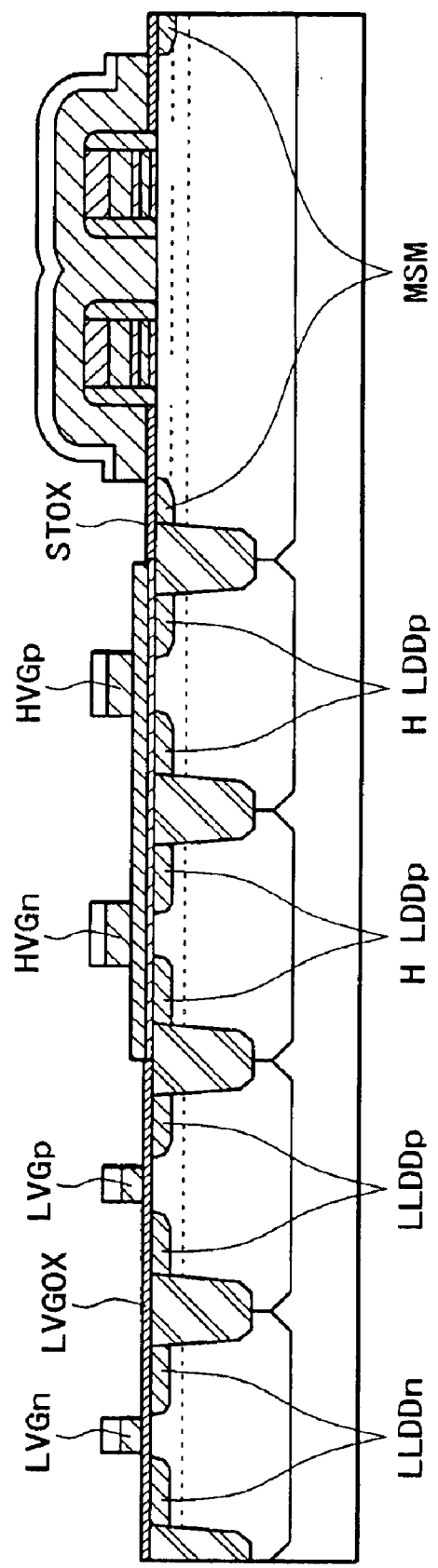
FIG. 43 is a sixth cross section of the fractional structure that comprises the nonvolatile memory cell NVC, n-type MOS transistor for core logic, and high-voltage-tolerant MOS transistor in the process of fabricating that structure.

Refer to FIG. 43. After removing the RES2 shown in FIG. 42 and cleaning, make a thermally oxidized layer (4 nm) on the exposed substrate surface (in the core logic transistor area and the selecting MOS transistor area). This layer serves as the gate oxide layer LVGOX of the MOS transistors n-MOS and p-MOS for core logic (LMOS) and the gate oxide layer STOX of the selecting MOS transistor (Str). While the gate oxide layers have different names LVGOX and STOX herein for convenience of explanation, it is evident that both layers are made having the same thickness by this fabrication method. Deposit non-doped polysilicon (150 nm) on the entire surface and inject impurities so that n-channels are formed in the areas where the n-MOS and n-HVMOS transistors are constructed and p-channels are formed in the areas where the p-MOS and p-HVMOS transistors are constructed. The concentration of impurities in each channel should be $1 \times 10$ to the 20 power or more. Then, deposit silicon oxide on the entire surface to make the silicon oxide layer (20 nm). Using the photolithography and dry etching techniques, form the following gate electrodes: LVGn of the n-MOS transistor; LVGp of the p-MOS transistor; HVGn of the n-HVMOS transistor; and HVGp of the p-HVMOS transistor. In the memory area (NVC area), form only the gate electrode end on the source side of the selecting MOS transistor (Str). Gate length of a 0.18 micron generation is, for example, 0.15 micron for core logic and 1.0 micron for HVMOS, which inevitably differs, depending on the voltage to be handled by a transistor. Then, using the photolithography technique and impurity ion implantation technique, where appropriate, form the n-type source and drain LLDDn of the n-MOS transistor to have a loose junction, the p-type source and drain LLDDp of the p-MOS transistor to have a loose junction, the n-type source and drain HLDDp of the n-HVMOS transistor to have a high-voltage-tolerant junction, and the p-type source and drain HLDDp of the p-HVMOS transistor to have a high-voltage-tolerant junction. These source and drain should be designed to assure that they have sufficient conjunction strength to withstand the voltage to be applied to them as requirements. The concentration of injected source and drain impurities for the transistors for core logic is higher than that for the HVMOS transistor. At the source of the selecting MOS transistor, an n-type diffusion layer MSM is formed. The MSM can be made equal to the LLDDn, according to the fabrication method disclosed herein.

Figure 44:
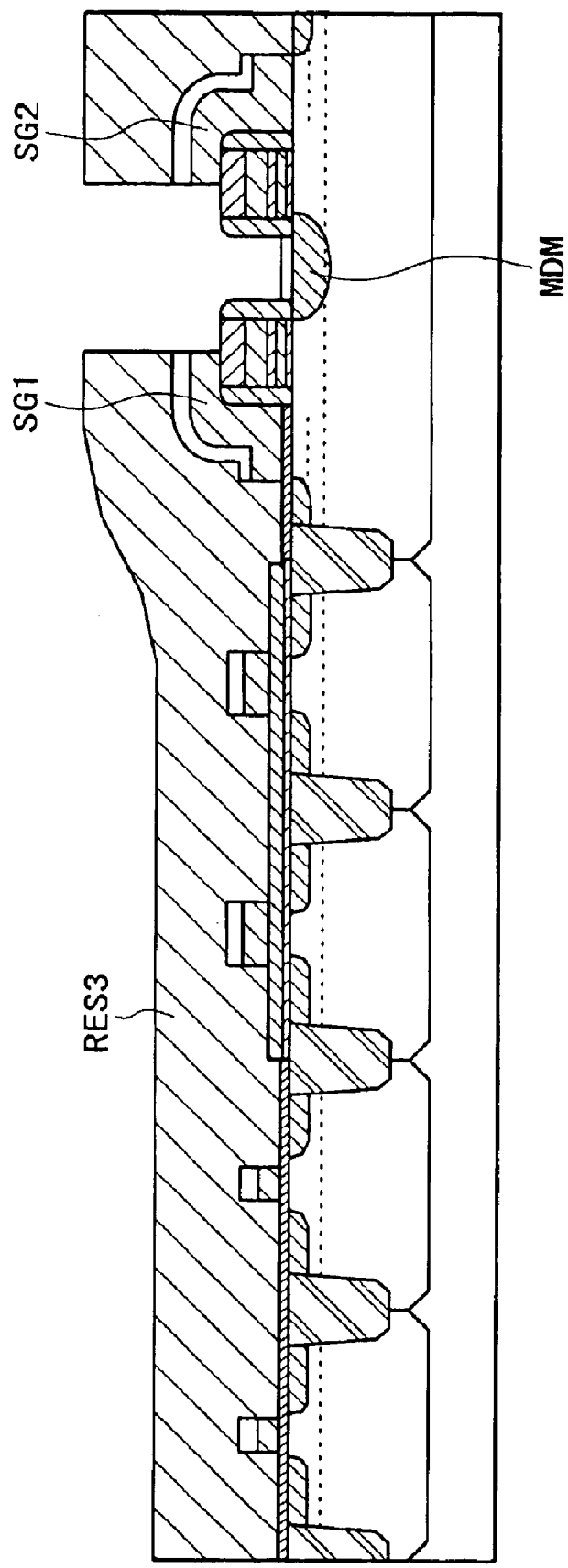
FIG. 44 is a seventh cross section of the fractional structure that comprises the nonvolatile memory cell NVC, n-type MOS transistor for core logic, and high-voltage-tolerant MOS transistor in the process of fabricating that structure.

Refer to FIG. 44. Here, form the drain region of the memory MOS transistor (Mtr). By the photolithography process, clear the photo resist RES3 from the section between the memory gates MG1 and MG2 where the drain of the memory MOS transistor (Mtr) is to be formed. Etch the oxide layer and polysilicon by anisotropic dry etching and form two gate electrodes SG1 and SG2 of the selecting MOS transistor (Str). By performing ion implantation of n-type impurities without removing the RES3, form the drain region MDM of the memory MOS transistor (MTr).

Figure 45:
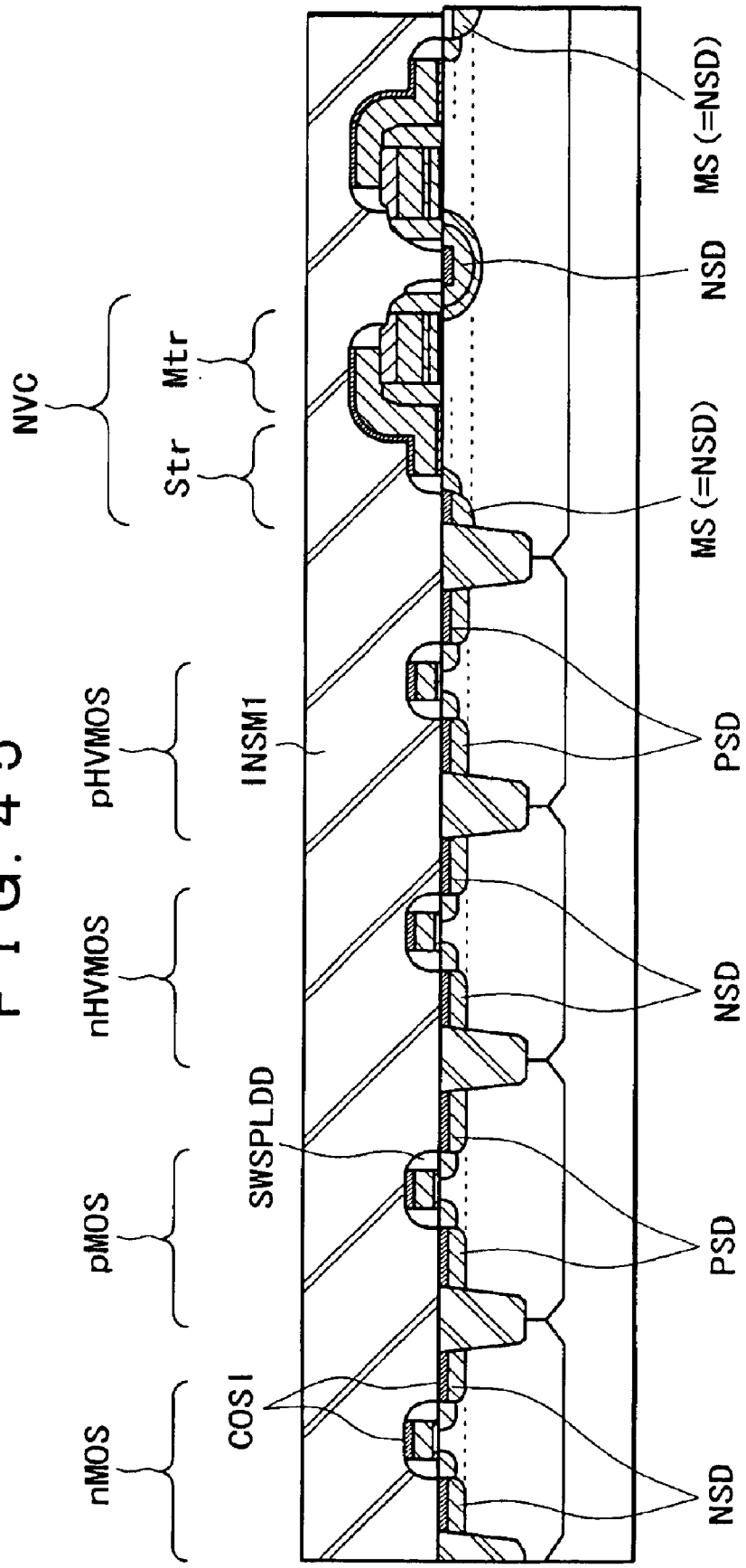
FIG. 45 is a eighth cross section of the fractional structure that comprises the nonvolatile memory cell NVC, n-type MOS transistor for core logic, and high-voltage-tolerant MOS transistor in the process of fabricating that structure.

Refer to FIG. 45. Deposit silicon oxide on the entire surface to make a silicon oxide layer (100 nm). Then, etch the entire surface by anisotropic dry etching. By this etching process, form lateral spacers SWSPLDD at all gate electrodes. Make high density n-type diffusion layers N at the sources and drains of all n-type transistors and high density p-type diffusion layers at the sources and drains of all p-type transistors by ion implantation and thermal treatment. Then, remove the oxide layer from the surface of all sources and drains and gate electrodes LVGn, LVGp, HVGn, HVGP, SG1, and SG2 to expose the silicon. Deposit metal cobalt (100 nm) on the front surface and make self-aligned cobalt silicide through application of thermal treatment at 700° C. Remove an excess of cobalt that did to react with silicon by cleaning and make a low-resistance cobalt silicide layer through re-application of thermal treatment at 750° C. Then, deposit silicon oxide on the entire surface to make an insulating oxide layer INSMI. Subsequent wiring process may be performed, using a conventional wiring technique.

While the invention made by the present inventors has been described specifically, based on its preferred embodiments, it will be appreciated that the present invention is not limited to the illustrative embodiments described hereinbefore and may be embodied in other modified forms without departing from its spirit or essential characteristics.

For example, the structure of the nonvolatile memory cell is not limited to its specific examples illustrated in FIGS. 4, 8 and other drawings and may be modified appropriately.

What is claimed is:

1. A semiconductor device comprising:
a nonvolatile memory unit including a plurality of rewritable nonvolatile memory cells;
a variable logic unit including a plurality of storage cells; and
a write permission circuit,
wherein logical functions of the variable logic unit are determined in accordance with logic constitution definition data to be loaded into the plurality of storage cells,
wherein each of said nonvolatile memory cells has a first MOS transistor for storing data and a second MOS transistor for selecting the first transistor,
wherein a first gate electrode of the first MOS transistor and a second gate electrode of the second MOS transistor are provided over a first region between a first impurity region and a second impurity region,
wherein the first region has no common impurity region for the first and second MOS transistor,
wherein a gate breaks down immunity voltage of the second MOS transistor is lower than a gate breaks down immunity voltage of the first MOS transistor, and
wherein the write permission circuit limits to write the logic constitution definition data from outside of the semiconductor device.

2. A semiconductor device according to claim 1, further comprising:
an IO circuit,
wherein when a password is inputted to the semiconductor device via the IO circuit, the write permission circuit permits to write the logic constitution definition data from outside of the semiconductor device.

3. A semiconductor device according to claim 1, further comprising:
a terminal,
wherein when a predetermined signal is supplied to the terminal, the write permission circuit permits to write the logic constitution definition data from outside of the semiconductor device.

4. A semiconductor device according to claim 1,
wherein the nonvolatile memory unit has a first storage area and a second storage area,
wherein when a password is inputted, the write permission circuit permits to write data into the first storage area, and
wherein the second storage area is permitted to write data without the password.

5. A semiconductor device according to claim 1,
wherein the first MOS transistor includes a conductive floating gate electrode covered with an insulation layer under the first gate electrode as a charge-storing region.

6. A semiconductor device according to claim 1,
wherein the first MOS transistor includes a charge-trapping insulation layer covered with an insulation layer under the first gate electrode as a charge-storing region.

7. A semiconductor device according to claim 1, further comprising:
a CPU coupled to the nonvolatile memory unit and the variable logic unit,
wherein the logic constitution definition data is stored in the nonvolatile memory unit.

8. A semiconductor device according to claim 7,
wherein the nonvolatile memory unit stores a control program performed by the CPU, and
wherein the CPU uses logical function of the variable logic unit set according to the logic constitution definition data by performing the control program.

9. A semiconductor device comprising:
a nonvolatile memory unit including a plurality of rewritable nonvolatile memory cells, a memory access circuit, and voltage circuit;
a variable logic unit including a plurality of storage cells; and
a write permission circuit,
wherein logical functions of the variable logic unit are determined in accordance with logic constitution definition data to be loaded into the plurality of storage cells, wherein each of the plurality of rewritable nonvolatile memory cells has a first MOS transistor for storing data and a second MOS transistor for selecting the first MOS transistor, wherein the memory access circuit has a third MOS transistor and performs logic operation for memory action to the nonvolatile memory cell, wherein the voltage circuit has a fourth MOS transistor and supplies a voltage for rewriting the data to said nonvolatile memory cell, wherein a first gate electrode of the first MOS transistor and a second gate electrode of the second MOS transistor are provided over a first region between a first impurity region and a second impurity region, wherein the first region has no common impurity region for the first and second MOS transistor, wherein gate insulation layers of the second, third, and fourth MOS transistors are formed to have their physical thicknesses fulfilling constraint $tL<=ts<tH$ where $ts$ is the physical thickness of the gate insulation layer of the second MOS transistor, $tL$ is the physical thickness of the gate insulation layer of the third MOS transistor, and $tH$ is the physical thickness of the gate insulation layer of the fourth MOS transistor, and wherein the write permission circuit limits to write the logic constitution definition data from outside of the semiconductor device.

10. A semiconductor device according to claim 9, further comprising:

an IO circuit, wherein when a password is inputted to the semiconductor device via the IO circuit, the write permission circuit permits to write the logic constitution definition data from outside of the semiconductor device.

11. A semiconductor device according to claim 9, further comprising:

a terminal, wherein when a predetermined signal is supplied to the terminal, the write permission circuit permits to write the logic constitution definition data from outside of the semiconductor device.

12. A semiconductor device according to claim 9, wherein the nonvolatile memory unit has a first storage area, and a second storage area, wherein when a password is inputted, the write permission circuit permits to write data into the first storage area, and wherein the second storage area is permitted to write data without the password.

13. A semiconductor device according to claim 9, wherein the first MOS transistor includes a conductive floating gate electrode covered with an insulation layer under the first gate electrode as a charge-storing region.

14. A semiconductor device according to claim 9, wherein the first MOS transistor includes a charge-trapping insulation layer covered with an insulation layer under the first gate electrode as a charge-storing region.

15. A semiconductor device according to claim 9, further comprising:

a CPU coupled to the nonvolatile memory unit and the variable logic unit, wherein the logic constitution definition data is stored in the nonvolatile memory unit.

16. A semiconductor device according to claim 15, wherein the nonvolatile memory unit stores a control program performed by the CPU, and wherein the CPU uses logical function of the variable logic unit set according to the logic constitution definition data by performing the control program.

* * * * *